(12) United States Patent
Kurjanowicz et al.

(10) Patent No.: US 6,584,036 B2
(45) Date of Patent: Jun. 24, 2003

(54) SRAM EMULATOR

(75) Inventors: Wlodek Kurjanowicz, Kanata (CA);
Jacek Misztal, Ottawa (CA)

(73) Assignee: ATMOS Corporation, Kanata (CA)

( * ) Notice: Subject to any disclaimer, the term of this patent is extended or adjusted under 35 U.S.C. 154(b) by 0 days.

(21) Appl. No.: 10/096,945

(22) Filed: Mar. 14, 2002

(65) Prior Publication Data

US 2002/0131320 A1 Sep. 19, 2002

(30) Foreign Application Priority Data

Mar. 14, 2001 (CA) ................................. 2340804

(51) Int. Cl.⁷ .................................. G11C 8/00
(52) U.S. Cl. .................. 365/233; 365/194; 365/230.06; 365/238.5
(58) Field of Search ................. 365/233, 194, 365/230.06, 238.5

(56) References Cited

U.S. PATENT DOCUMENTS

| | | | |
|---|---|---|---|
| 5,276,843 A | | 1/1994 | Tillinghast et al. |
| 5,430,681 A | | 7/1995 | Sugawara et al. |
| 5,615,328 A | | 3/1997 | Hadderman et al. |
| 6,005,823 A | * | 12/1999 | Martin et al. ........... 365/230.08 |
| 6,075,740 A | | 6/2000 | Leung |
| 6,078,547 A | | 6/2000 | Leung |
| 6,094,704 A | * | 7/2000 | Martin et al. ................ 711/105 |
| 6,151,664 A | | 11/2000 | Borkenhagen et al. |
| 6,172,893 B1 | * | 1/2001 | Ryan ............................ 365/49 |
| 6,301,183 B1 | * | 10/2001 | Bondurant et al. ......... 365/222 |
| 6,519,689 B2 | * | 2/2003 | Manning ..................... 711/169 |

OTHER PUBLICATIONS

Allan L. Silburt et al. "A 180–MHz 0.8 μm BiCMOS Modular Memory Family of DRAM and Multiport SRAM", *IEEE Journal of Solid–State Circuits*, vol. 28, No. 3, p. 222–232 Mar. 1993.

* cited by examiner

*Primary Examiner*—Son T. Dinh
(74) *Attorney, Agent, or Firm*—Leslie Anne Kinsman; Borden Ladner Gervais LLP

(57) ABSTRACT

Generally, the present invention provides memory controller for providing a synchronous SRAM interface to an embedded SDRAM. To achieve maximum performance SDRAM timing, row circuitry is emulated in the controller to produce SDRAM control signals. Control signal timing is optimized for read and write operations and can be flexibly adjusted using control registers. Since the timing of DRAM control signals is based on the embedded DRAM timing emulation, all margins can be minimized and the performance of the memory can be maximized. The SRAM interface can operate in a wide range of clock frequencies, which are not restricted to ratios of multiples of the embedded DRAM clock frequency.

32 Claims, 29 Drawing Sheets

SRAM EMULATOR

FIELD OF THE INVENTION

The present invention relates to SRAM interfaces for controlling embedded SDRAM for system on chip (SOC) applications.

BACKGROUND OF THE INVENTION

Commodity SRAM and DRAM memory devices are typically used in personal computer systems for data storage. In a personal computer system, the memories are controlled either by the CPU or by an on-board memory controller. To ease system level design, commodity memories are usually required to meet minimum industry performance standards, or system manufacturer imposed performance standards such as the Intel PC133 SDRAM standard. These standards allow for the design of memory controllers that can maximize the performance of any memory that meets industry standards. Hence signalling and timing details for operating the memory are somewhat transparent to system designers since they are under the control by a CPU or memory controller. However, the limited bandwidth, caused in part by the capacitance and inductance of wire leads of the external memory prevents the memory from operating at its full potential.

One solution to this problem is to embed memory onto processors and other system-on-chip (SOC) devices, such as application specific integrated circuits (ASIC). But because SOC devices are usually application specific, there are very few standards that need to be adhered to due to the customized nature of the memory.

SRAM is commonly embedded in SOC devices because of the compatibility of its manufacturing process with logic manufacturing processes. The drawback of embedding SRAM is the relatively large area it occupies for a small storage density. New manufacturing processes allow DRAM to be embedded onto SOC devices. Embedded DRAM, such as SDRAM, are practical for SOC devices where large amounts of memory are required without compromising excessive silicon area. This high level of integration reduces costs and provides other well-known system level benefits, especially for portable applications, or in applications where physical space is limited.

Despite the advantages of embedding DRAM over SRAM onto SOC devices, overall system performance of embedded DRAM remains inadequate for high-speed applications. Control of an SRAM does not require many signals, and the timing of these signals is not heavily constrained. Hence SOC designers have been able to directly access embedded SRAM with minimum additional peripheral logic. For example, a read operation from an asynchronous SRAM only requires a write enable signal (WE) to be at the high logic level and a change in an address from which data is to be read from. SDRAM on the other hand, is more complex because it requires more signals, and the timing of the signals are tightly constrained within preset limits. Memory addresses are multiplexed into row and column addresses, and specific combinations of column address strobe (CAS), row address strobe (RAS), write enable (WE), chip select (CS) and specific address signals are applied to issue specific commands which determine the DRAM operation. In a read operation, row addresses must be asserted during a "bank activation" command cycle. Then a fixed time interval must pass before a "read" command and column addresses can be asserted. This fixed time interval is typically specified by the SDRAM manufacturer, and can vary from manufacturer to manufacturer. Due to this additional complexity, simple interfaces, or emulators, that allow SOC processors to transparently access embedded DRAM have been developed.

SRAM interfaces have been chosen because SRAMs are simple and straightforward to access. In other words, the SOC processor "sees" an SRAM device through the SRAM interface and issues SRAM control signals to access the SDRAM memory. The SRAM interface then generates the appropriate SDRAM control signals and converts received linear SRAM addresses into separate row and column addresses. Just as importantly, the SRAM interface also controls timing for activating the appropriate SDRAM control signals.

FIG. 1 is a block diagram of a prior art graphic processing ASIC that uses embedded DRAM memory. This ASIC has a video codec engine (VCE), digital signal processor (DSP), video processing unit (VPU), memory interface 50 and SDRAM memory 52 divided into two different blocks. SDRAM memory 52 can be stacked, trench or planar capacitor DRAM. Memory interface 50 is an SRAM interface, which generates SDRAM control signals from SRAM type commands. Unfortunately, prior art SRAM interfaces generate SDRAM control signals with worst-case scenario timing. More specifically, the SDRAM control signals are activated at times well beyond the minimum required time. This is mainly due to the fact that the internal SDRAM clock signals are generated synchronously to the external system clock of the SOC device. FIG. 2 shows a read access timing diagram for the system of FIG. 1.

The timing diagram of FIG. 2 shows traces for the system clock signal SCLK and addresses and commands ADDR/CMND received by memory interface 50 for generation of activate signal ACT, row clock RCLK, column clock CCLK, precharge clock signal PCHCK and output data Q. This example illustrates a read operation from the system of FIG. 1. The SDRAM memory provides data Q in response to the signals generated by the memory interface 50. Commands are latched on the first rising edge of SCLK 60, and decoded to generate the active ACT signal shortly thereafter. The rising edge of ACT triggers the generation of the RCLK pulse for latching a row address to activate the appropriate memory bank. Another command is latched and decoded on the second rising edge of SCLK 62 for generating the CCLK pulse. A column address is latched on the rising edge of the CCLK pulse, resulting in the output of valid data Q shortly thereafter. A PCHCK precharge pulse is then generated to precharge all the memory banks in preparation for subsequent accesses. The system of FIG. 1 requires a minimum of two clock cycles to provide data after the initial read command and row address is latched. This is due to the fact that the row control signal RCLK is generated in the first system clock cycle and the column control signal CCLK is generated in the subsequent system clock cycle.

Unfortunately, the embedded SDRAM is capable of providing data earlier than the system of FIG. 1 allows. More specifically, the embedded SDRAM is capable of latching column addresses earlier by issuing the CCLK pulse earlier. But because the row and column clock signals RCLK and CCLK are synchronized to the system clock SCLK, the earliest that the CCLK pulse could appear is after the second rising edge of the system clock. In a practical example, if the SDRAM core has a minimum access time of 5 ns, the time between CCLK and valid data is 2.5 ns, precharge requires 1.5 ns and the SCLK is a 100 MHz clock with a period of 10 ns, the system of FIG. 1 would require a minimum of 12.5 ns to generate valid data. 12.5 ns is the sum of one fall clock cycle time plus the CCLK to valid data time. However, the SDRAM memory is capable of providing data in 7.5 ns. In operation though, the system of FIG. 1 only provides new data every 20 ns, or every two clock cycles. The SDRAM on the other hand, is capable of providing new data every 9 ns, which is the sum of 7.5 ns as previously discussed plus 1.5 ns of precharge time.

Some SRAM interface designs attempt to improve SDRAM access times by using clock multipliers to generate intermediate high frequency clock signals from the external system clock. Although this technique will increase SDRAM performance, it is not cost effective because it is difficult to design a clock circuit that will reliably generate a high frequency clock signal. Additionally, this technique does not fully optimise SDRAM performance because it is inherently difficult to control an SDRAM that operates in a clock domain having finite frequency granularity.

Hence, SOC devices having embedded SDRAM memory will not operate at their full potential due to limitations in the SRAM interface that control them.

Therefore, there is a need for an SRAM interface that generates control signals with the appropriate timing for maximizing embedded SDRAM performance.

SUMMARY OF THE INVENTION

It is an object of the present invention to obviate or mitigate at least one disadvantage of previous SRAM interface circuits. In particular, it is an object of the present invention to provide a system and method for maximizing embedded SDRAM performance.

In a first aspect, the present invention provides an interface circuit for controlling embedded DRAM memory having a row timing circuit for activating row decoders and bitline sense amplifiers, and column decoders for accessing bitlines. The interface circuit includes a command decoder for receiving command signals and providing control signals in response to a system clock, and a clock sequencer for activating the row timing circuit in response to the control signals, and for activating the column decoders at a predetermined delay after activation of the row timing circuit. The column decoders are activated after the bitline sense amplifiers are activated and within the same system clock cycle that the row timing circuit is activated.

In an alternate embodiments of the present aspect, the command signals include SRAM control signals, the clock sequencer generates a precharge clock signal for precharging the bitlines after the column decoders are activated, and the row timing circuit generates a sense amplifier activation signal for turning on the bitline sense amplifiers. In yet another embodiment of the present aspect, the clock sequencer includes a row timing emulator for generating an emulated row timing signal at the same time the sense amplifier activation signal is generated, and a margin delay circuit for receiving the emulated row timing signal and generating a column clock signal for activating the column decoders.

In alternate aspects of the present embodiment, the row timing circuit is substantially identical to the row timing emulator and has a layout substantially identical to the layout of the row timing circuit. The margin delay circuit includes programmable delay circuits for delaying generation of the column clock signal, and receives a test signal for delaying generation of the column clock signal. In a further aspect of the present embodiment, the clock sequencer precharges the bitlines when an inactive clock cycle following an active system clock cycle is detected by a page mode control circuit.

In a second aspect, the present invention provides a method for accessing a memory bank of an embedded DRAM within a single clock cycle of a system clock controlled by an interface circuit synchronized to the system clock. The method includes receiving address and commands on an edge of the system clock, activating row decoders for driving a wordline of the memory bank corresponding to the address, activating bitline sense amplifiers of the memory bank, and activating column decoders of the memory bank at a predetermined delay time after the row decoders are activated.

In alternate embodiments of the present aspect, the delay time is longer for a read command than for a write command, and the bitlines of the memory bank are precharged after the column decoders are activated. In a further embodiment of the present aspect, the interface is set for page mode operation where the bitlines of unselected memory banks are precharged after address and commands are received, and the wordline is driven for the duration of the single clock cycle. In yet another embodiment of the present aspect, all memory banks are precharged in an inactive system clock cycle following an active system clock cycle.

In a third aspect, the present invention provides an interface circuit for controlling an embedded DRAM having column decoders, row decoders, bitline sense amplifiers and a row timing circuit for activating the row decoders and the bitline sense amplifiers. The interface circuit includes a row timing emulator, a margin delay circuit, a page mode control circuit, and a clock combiner. The row timing emulator receives an activation clock signal synchronized to a system clock for generating an emulated row timing signal. The margin delay circuit receives the emulated row timing signal for generating a column clock signal for activating the column decoders, and a precharge clock signal. The page mode control circuit receives a page mode signal, the system clock and the activation clock signal for generating a page mode precharge clock signal. The a clock combiner receives the page mode signal for activating the row timing circuit in response to one of a fast activation clock signal, the precharge clock signal, and the page mode precharge clock signal.

In alternate embodiments of the present aspect, the row timing emulator is substantially identical to the row timing circuit, the margin delay circuit includes programmable delay circuits for delaying generation of the column clock signal and the precharge clock signal, and the programmable delay circuits are configurable by registers. In another embodiment of the present aspect, the page mode control circuit includes programmable delay circuits for delaying generation of the page mode precharge clock signal. In yet another embodiment of the present aspect, the margin delay circuit generates the column clock signal in response to the emulated row timing signal after a first delay in a write operation and a second delay in a read operation, where the first delay is shorter than the second delay.

In another embodiment of the present aspect, the page mode control circuit is disabled when the page mode control signal is inactive and the page mode control circuit generates the page mode precharge clock signal when the page mode control signal is active and the memory access signal is inactive following an operation where the memory access signal is active. In yet another embodiment of the present aspect, the clock combiner generates the row clock signal in response to the precharge clock signal when the page mode control signal is inactive and the clock combiner generates the row clock signal in response to the page mode precharge clock signal when the page mode control signal is active.

In a fourth aspect, the present invention provides A method for customizing a row timing emulator and margin delay circuit of an interface circuit for controlling an embedded DRAM having a row timing circuit for activating row decoders and bitline sense amplifiers, and column decoders for accessing the bitlines. The method includes determining an optimum bitline sense amplifier activation delay time for activating the bitline sense amplifiers after row addresses are latched, determining an optimum column decoder activation delay time for activating the column decoders after the bitline sense amplifiers are activated, programming delay elements of the row timing circuit for activating the bitline sense amplifiers at the optimum bitline sense amplifier activation delay time, programming delay elements of the row timing emulator for generating an emulated row timing signal at the optimum bitline sense amplifier activation time, and programming delay elements of the margin delay circuit for activating the column decoders at the optimum column decoder activation delay time after receiving the emulated row timing signal.

In an alternate embodiment of the present aspect, the step of determining an optimum column decoder activation delay time includes determining the optimum column decoder activation delay times for read operations and write operations, where the margin delay circuit is programmed to activate the column decoders at the optimum column decoder activation delay times for read and write operations.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a memory controller for providing an SRAM interface to an embedded SDRAM. To achieve maximum SDRAM performance, row timing circuitry of the memory banks is emulated in the controller to produce SDRAM control signals. Control signal timing is optimized for read, write, concurrent read/write and refresh operations and can be flexibly adjusted using control registers or wiring options. Since the timing of SDRAM control signals is based on emulated row timing, all margins can be minimized and the performance of the memory can be maximized. The SRAM interface can operate in a wide range of clock frequencies, which are not restricted to ratios or multiples of the embedded DRAM clock frequency.

ASIC devices are application specific, and therefore any embedded SDRAM that is required will be customized for the ASIC. ATMOS Corporation provides an embedded DRAM compiler, called the SoC-RAM™ compiler that allows designers to create custom memory macrocells in a short period of time. Customizable aspects of the embedded memory macrocells include I/O bus width, number of banks, operating conditions and clock speed, for example. Irregardless of its size, each memory macrocell includes core peripheral circuits in addition to the memory cells, such as bitline sense amplifiers, sense amplifier timing circuits, row timing control circuits, wordline drivers, row decoders and column decoders for example. As mentioned earlier, a memory control circuit, commonly called an SRAM interface circuit, is often required to permit the system level designer to easily interface system control signals with the aforementioned core peripheral circuits of the embedded DRAM memory. According to an embodiment of the present invention, the SRAM interface circuit includes a dummy row timing control circuit substantially identical to the row timing control circuits, for emulating the timing of generated row control signals. The SRAM interface is preferably compiled with the memory macrocell.

Figure 1:
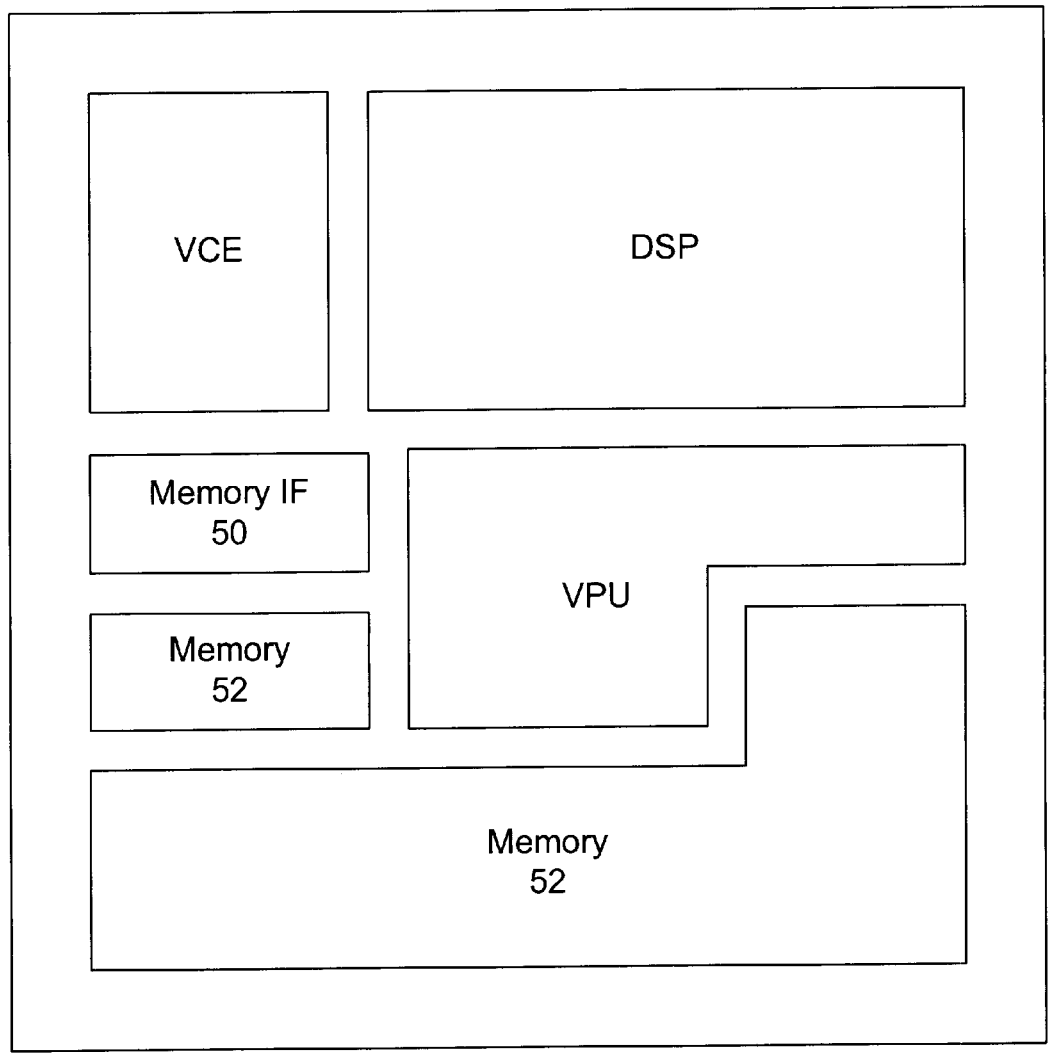
FIG. 1 is a block diagram of a prior art system on chip device with DRAM memory.
Figure 2:
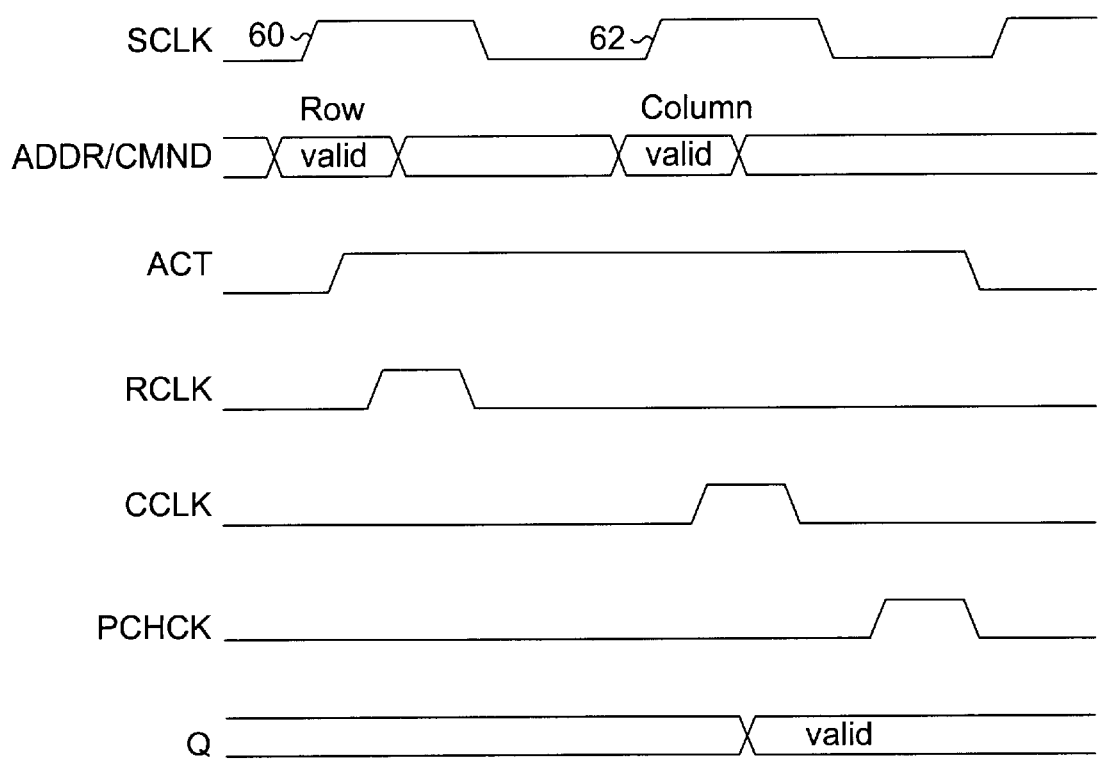
FIG. 2 is a timing diagram illustrating access operations of the DRAM memory in FIG. 1.
Figure 3:
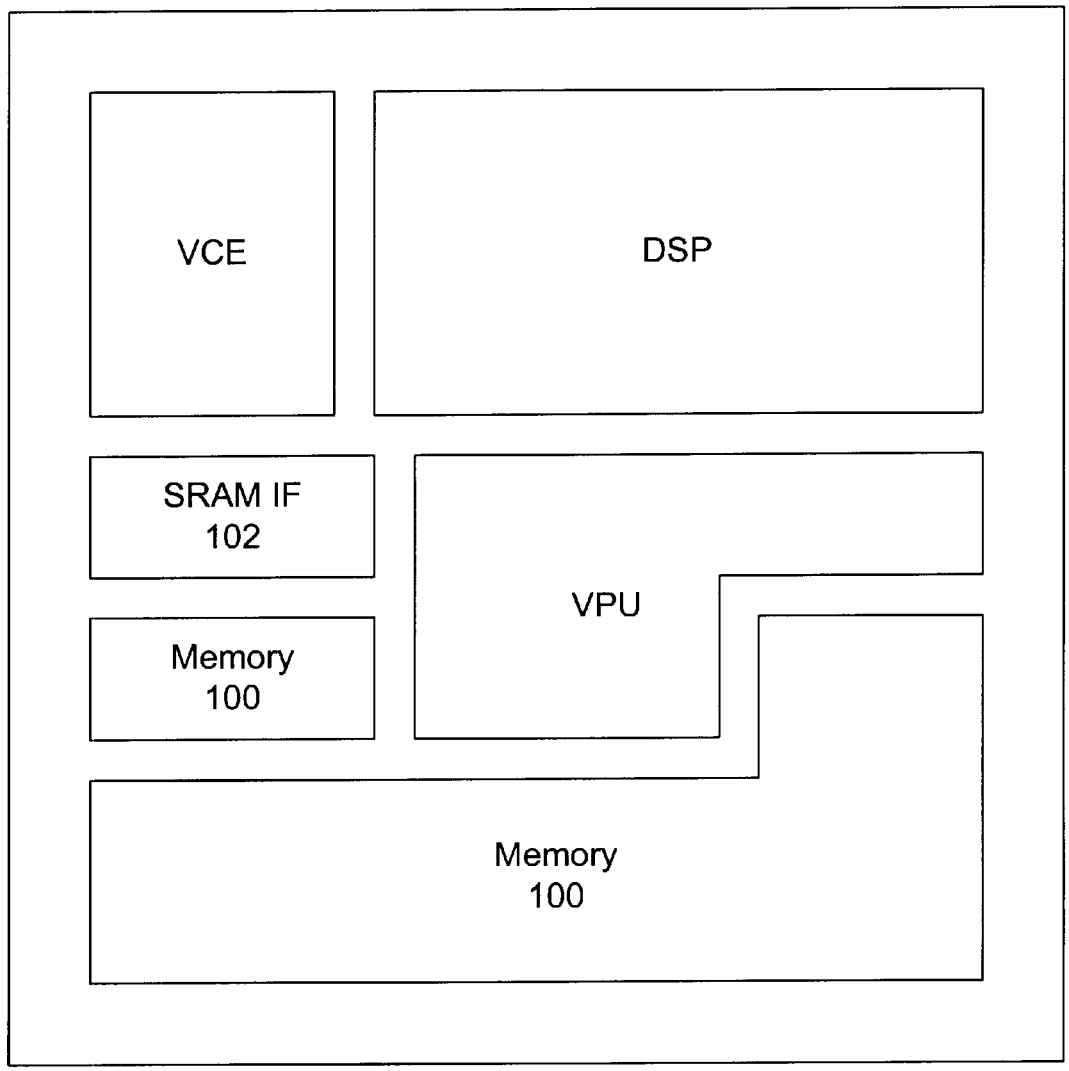
FIG. 3 is a block diagram of a system on chip device with an SRAM interface according to an embodiment of the present invention.

FIG. 3 shows a block diagram of a graphic processing ASIC having embedded DRAM memory 100 and an SRAM interface 102 according to an embodiment of the present invention. The graphic processing ASIC of FIG. 3 is essentially the same as the graphics processing ASIC shown in FIG. 1. DRAM memory 100 can be stacked, trench or planar capacitor DRAM, organized as banks. In the present embodiment, memory 100 is synchronous DRAM, hereinafter referred as SDRAM. Due to the complexity of the control signals required to control SDRAM memory 100, SRAM interface 102 has been designed to receive the simpler SRAM type control signals and generate the appropriate SDRAM control signals with proper timing. By using SRAM interface 102 of the present embodiment, data can be provided within one system clock cycle. For comparison purposes, SRAM interfaces of the prior art only allowed the embedded memory to provide data within two system clock cycles as shown in FIG. 2. Therefore the graphics processing ASIC of FIG. 3 has improved performance over the graphics processing ASIC of FIG. 1. In employing the SRAM interface as contemplated by the present invention, any device having embedded SRAM memory can have improved overall system performance.

Figure 4:
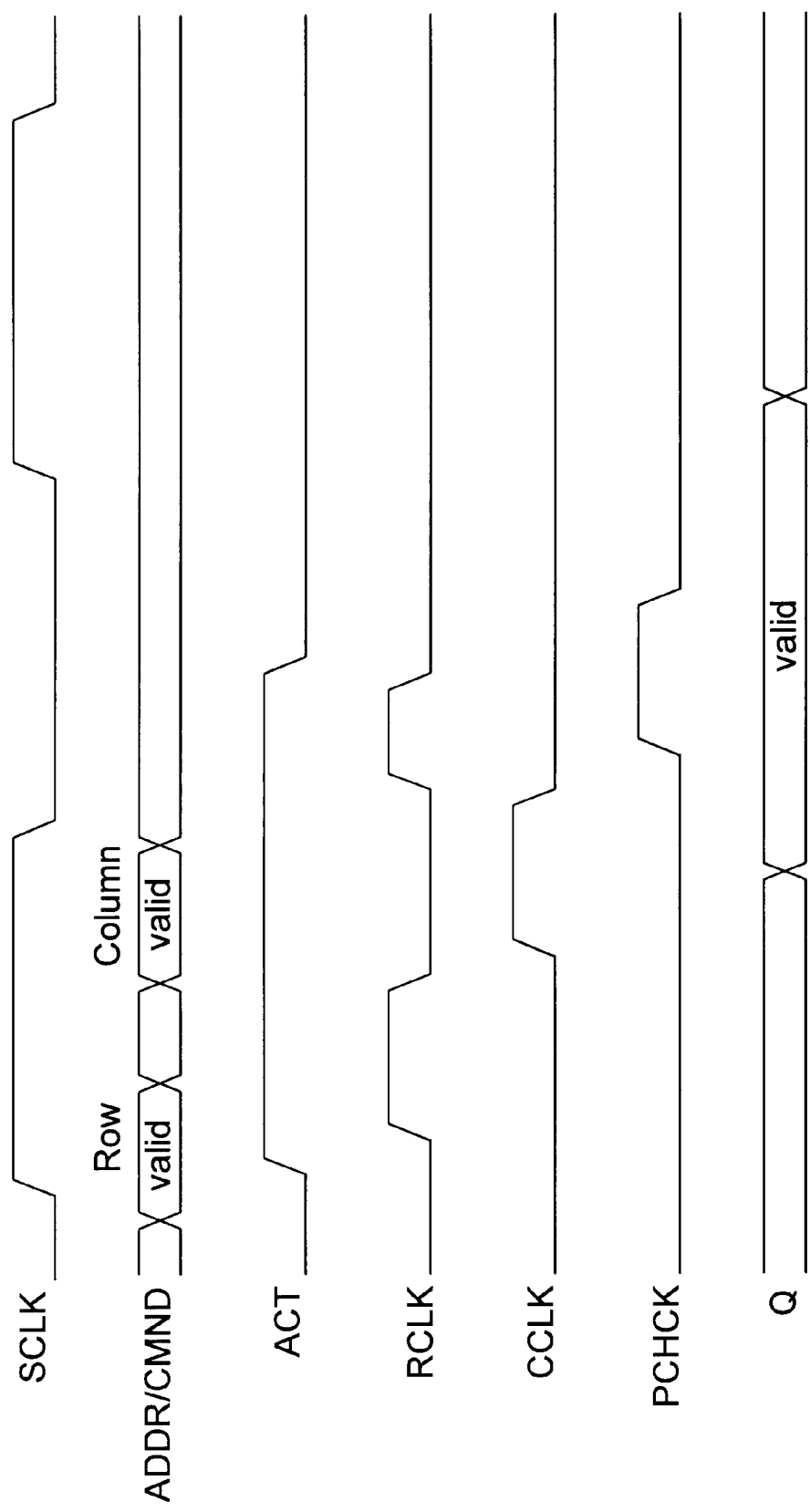
FIG. 4 is a timing diagram illustrating access operations for the DRAM memory of FIG. 3.

FIG. 4 is a timing diagram illustrating several SDRAM control signals generated by the SRAM interface 102 of FIG. 3 for an initial read access operation. The signal traces shown in FIG. 4 are the same as those described for the timing diagram of FIG. 2. Row clock RCLK is generated after the first rising edge of SCLK to latch row addresses and activate the appropriate memory banks as in the timing diagram of FIG. 2. Due to the emulated row timing in SRAM interface 102, the column clock CCLK is generated by SRAM interface 102 within the first system clock cycle to latch the column address. Shortly thereafter, valid data is output on Q. Therefore data from the SDRAM memory becomes valid within a single system clock cycle. If desired, a subsequent RCLK signal can be generated on the next rising edge of SCLK to latch the next row address for a subsequent access. Thus the emulated row timing in SRAM interface 102 minimizes timing margins to minimize the access time and maximize SDRAM memory performance to improve overall system performance.

Figure 5:
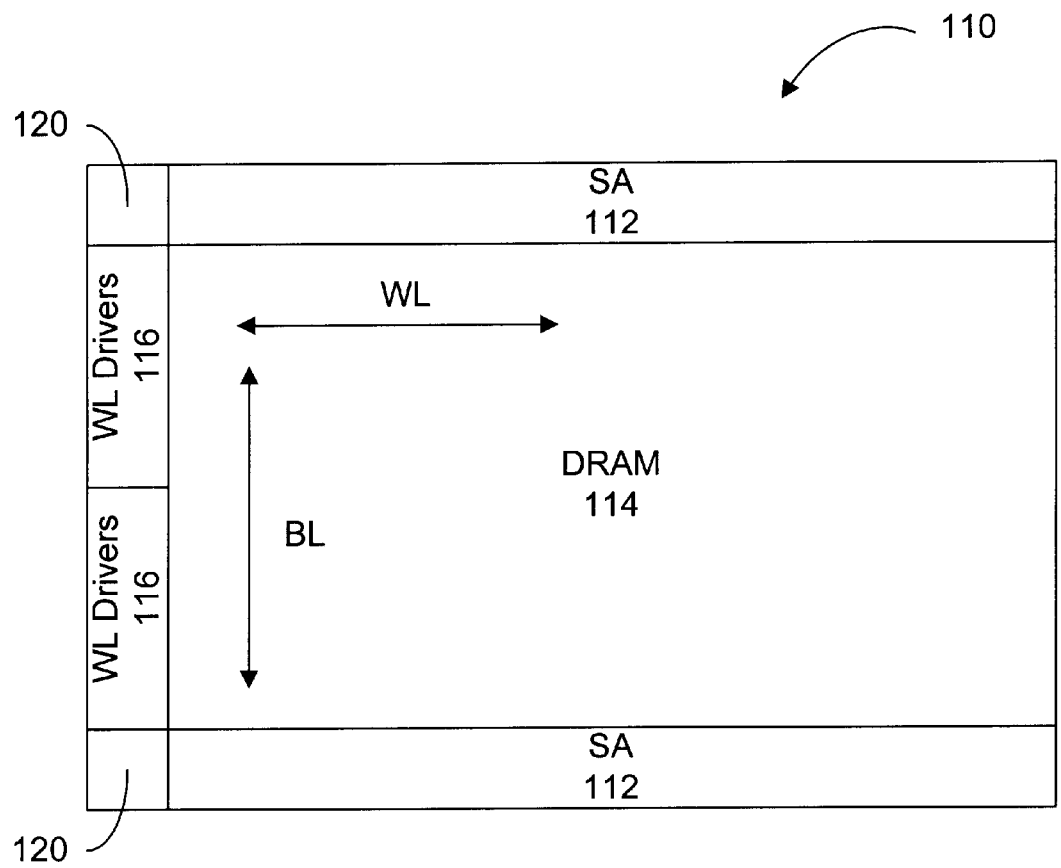
FIG. 5 is a block diagram of one memory bank of the DRAM memory of FIG. 3.

Following is a description of an SDRAM memory macrocell that can be used in memory 100 of FIG. 3. FIG. 5 shows the relevant peripheral circuits of the memory macrocell required for accessing the memory array. Macrocell 110 includes an array of SDRAM memory 114 where complementary pairs of bitlines are formed in the vertical direction and wordlines are formed in the horizontal direction. Each complementary pair of bitlines are coupled to respective bitline sense amplifiers (SA) 112 for reading out data. Each wordline is coupled to wordline drivers 116 for turning on, or activating, a selected wordline. Row timing circuits 120 are responsible for turning on the sense amplifiers 112. The memory 114 is organized as two banks, each having a corresponding row timing circuit 120 and bitline sense amplifiers 112 associated with it.

In a general read operation according to an embodiment of the present invention, row addresses are latched during the active RCLK pulse and the selected bank is precharged. After a predetermined time, a wordline of the selected bank is turned on via wordline drivers 116. When the selected wordline is turned on, all memory cell access transistors connected to it will turn to couple their respective storage capacitors to their bitlines. The precharged potential level of the bitlines will change by several millivolts, depending on the logic state of the stored bit. As will be appreciated by one skilled in the art, some time should elapse after the row address is latched to allow the potential level of the bitlines to change, during which the sense amplifiers 112 should not be turned on. Row timing circuits 120 turn on sense amplifiers 112 immediately after the potential level of the bitlines have settled. When sense amplifiers 112 are turned on, the potential levels of the bitlines are amplified to supply voltage potential levels. An active CCLK pulse is generated by the SRAM interface 102 of FIG. 3 to latch the column address at the same time the sense amplifiers 112 are turned on. Column decoders (not shown) are then turned on and the data from the bitlines are transferred out to the output Q.

Figure 6:
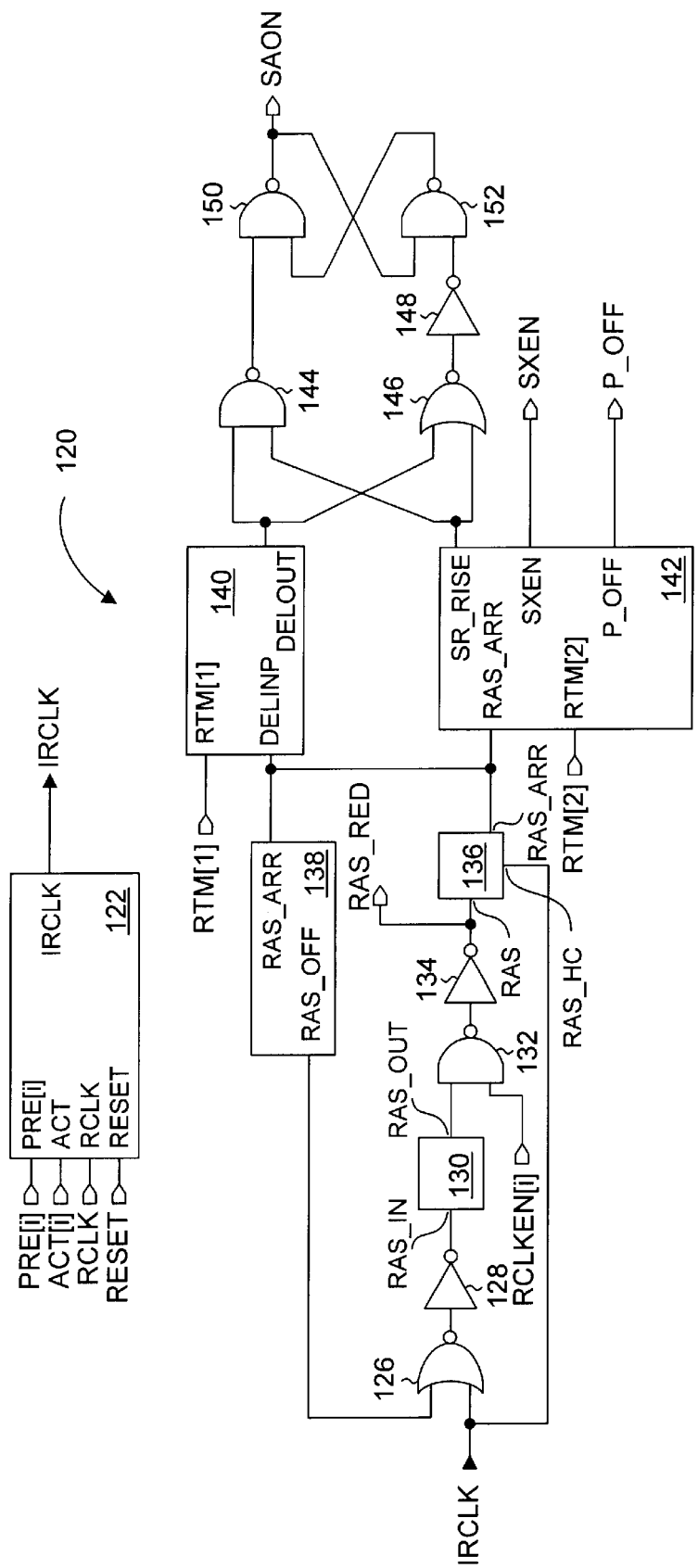
FIG. 6 is a circuit schematic of the row timing circuit of FIG. 5.

FIG. 6 shows a circuit schematic of the row timing circuit 120 from macrocell 110 of FIG. 5. Row timing circuit 120 includes several adjustable delay circuits to accommodate the various macrocell designs. These adjustable delays allow designers to closely match the sense amplifier activation timing with their selected macrocell design. More specifically, the sense amplifiers are turned on as soon as the potential levels on the bitlines have settled after a wordline is activated. The time required for row address latching, decoding and wordline driving are also taken into account and programmed into the row timing circuit. Row timing circuit 120 includes an internal row clock generator 122, non-inverting RAS margin delay circuit 130, non-inverting RAS delay circuit 136, non-inverting RAS fall delay circuit 138, non-inverting SR fall delay circuit 140, and non-inverting SR rise generator circuit 142. Row clock generator 122 receives block decoded precharge signal PRE[i], block decoded activate signal ACT[i], row clock signal RCLK and system reset signal RESET for providing internal row clock signal IRCLK. IRCLK is connected to one input of NOR gate 126 and the RAS_HC input of RAS delay circuit 136. The other input of NOR gate 126 is connected to the RAS_OFF output of RAS fall delay circuit 138. The output of NOR gate 126 is connected to the RAS_IN input of RAS margin delay circuit 130 via inverter 128. The RAS_OUT output of RAS margin delay circuit 130 is connected to an input of NAND gate 132. The other input of NAND gate 132 receives block decoded row clock enable signal RCLKEN[i], and its output is connected to the RAS input of RAS delay circuit 136 via inverter 134. The RAS_ARR output of RAS delay circuit 136 is connected to the RAS_ARR input of SR rise generator circuit 142, the RAS_ARR input of RAS fall delay circuit 138 and the DELINP input of SR fall delay circuit 140. SR fall delay circuit 140 also receives row timing adjustment signal RTM[1]. The output DELOUT of SR fall delay circuit 140 is connected to an input of NAND gate 144 and NOR gate 146. The other input of NAND gate 144 and NOR gate 146 is connected to the output SR_RISE of SR rise generator circuit 142. SR rise generator circuit 142 also receives row timing adjustment signal RTM[2], and provides secondary row decoder enable signal SXEN and precharge device disabling signal P_OFF. The output of NAND gate 144 is connected to an input of NAND gate 150 and the output of NOR gate 146 is connected to an input of NAND gate 152 via inverter 148. NAND gates 150 and 152 are arranged in a cross-coupled configuration. The output of NAND gate 150 drives sense amplifier activation signal SAON to turn on the sense amplifiers 112 from FIG. 5. SR rise generator 142 is designed to delay the rising edge of the RAS_ARR output of RAS delay circuit 136, and SR fall delay circuit 140 is a simple delay line that delays both the rising and the falling edges of the RAS_ARR output of RAS delay circuit 136. The purpose of SR rise generator 142 is to delay activation of the sense amplifiers, via signal SAON, to permit all the wordlines to settle. The wordlines are driven when SXEN is driven to the high logic level. Furthermore, the bitline precharge devices are turned off prior to activation of the wordlines via signal P_OFF.

The general operation of row timing circuit 120 for a read cycle is now described with reference to FIG. 6. It is assumed in the starting state of the circuit that DELOUT from SR fall delay circuit 140 is at the low logic level, SR_RISE from SR rise generator circuit 142 is at the low logic level, and a low logic level is latched at the output of NAND gate 150. Internal row clock generator 122 generates a high logic level IRCLK signal in response to ACT[i] at the high logic level on the rising edge of RCLK. The high logic level IRCLK signal received at NOR gate 126 eventually propagates and arrives at the SR rise generator 142 via the chain of logic gates, delay circuit 130 and RAS delay circuit 136. It should be noted that the high logic level IRCLK signal propagates through NAND gate 132 when clock signal RCLKEN[i] is at the high logic level. The delay for a rising edge is set to be longer through SR rise generator circuit 142 than SR fall delay circuit 140. The delay for a falling edge is set to be longer through SR fall delay circuit 140 than SR rise generator circuit 142. Therefore DELOUT from SR fall delay circuit 140 changes to the high logic level first, causing NOR gate 146 to drive the input of inverter 148 to the low logic level. NAND gate 152 having its input driven to the high logic level by inverter 148 is now ready to latch the high logic level of SAON. The high logic level RAS_ARR output from RAS delay circuit 136 eventually propagates through RAS fall delay circuit 138 to latch the low logic level IRCLK signal. The delay through RAS fall delay circuit 138 is relatively short in duration when compared to the delays of blocks 140 and 142. SXEN is eventually driven to the high logic level to activate the appropriate row decoders and wordline. When output SR_RISE changes to the high logic level, NAND gate 144 drives its respective input of NAND gate 150 to the low logic level. Signal SAON is then driven and latched at the high logic level to turn off bitline precharge devices and to turn on the sense amplifier circuits 112 of the memory block. To reset row timing circuit 120, signal RESET is set to the high logic level. This causes IRCLK to fall to the low logic level, which in turn eventually sets SAON to the low logic level. The delays through blocks 130, 136, 138 and 140 are customizable by the designer to meet system specifications. In general, the aforementioned delay blocks determine when SAON becomes active after a high logic level activation signal ACT [i], to signal the beginning of a memory access cycle, is received. The circuit details of delay blocks 130, 136, 138, 140 and 142 shown in FIG. 6 are described later.

Figure 7:
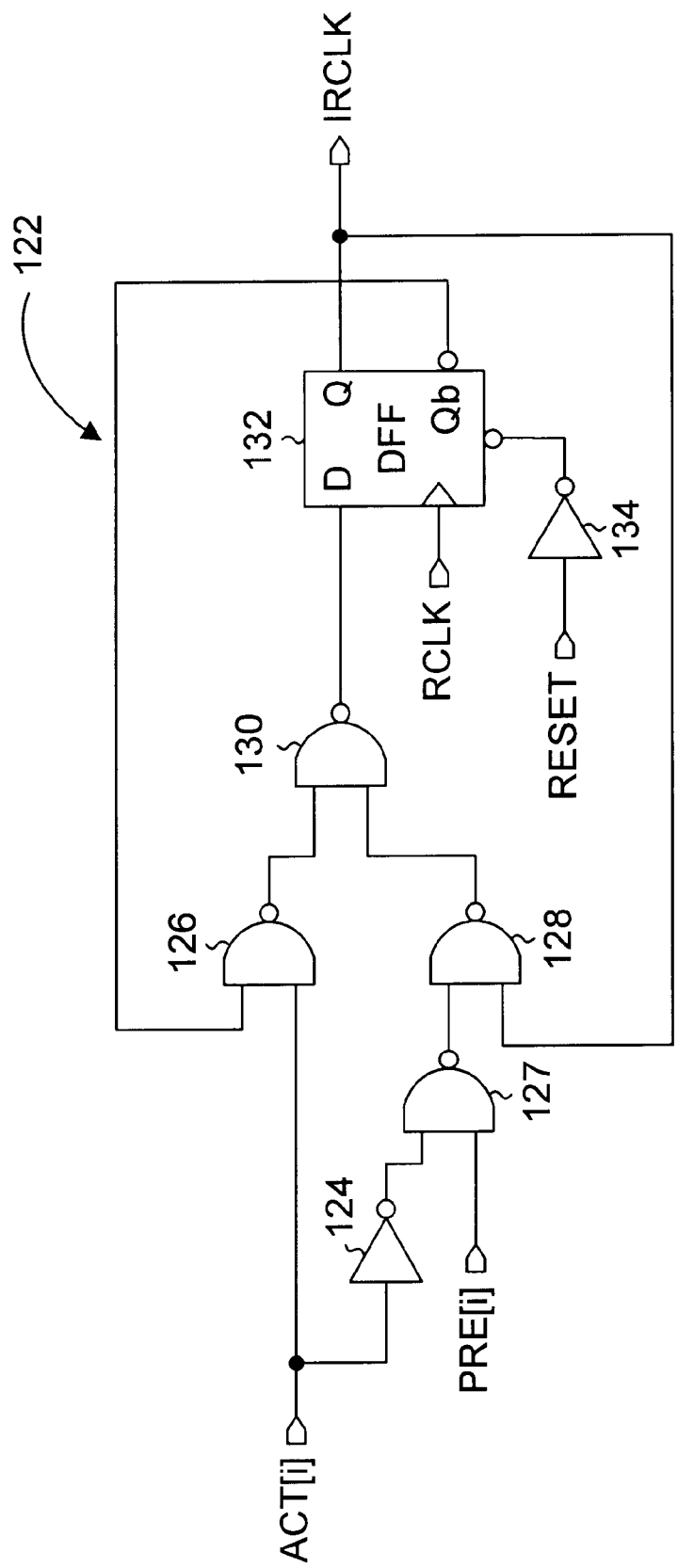
FIG. 7 is a circuit schematic of the internal row clock generator circuit of FIG. 5.

FIG. 7 is a circuit schematic of the internal row clock generator 122 shown in FIG. 6. Row clock generator 122 generates the internal row clock signal IRCLK after receiving an active ACT[i] signal. Row clock generator 122 receives precharge signal PRE[i] at an input of NAND gate 127, activation signal ACT[i] at the other input of NAND gate 127 via inverter 124, and at an input of NAND gate 126. The output of NAND gate 127 is connected to an input of NAND gate 128. The outputs of NAND gates 126 and 128 are connected to the inputs of NAND gate 130, whose output drives the D input of flip-flop 132. Flip-flop 132 receives clock signal RCLK and a reset signal RESET via inverter 134, for providing complementary outputs from its Q and Qb outputs. The Q output is the internal row clock signal IRCLK that is also connected to the other input of NAND gate 128. The Qb output is connected to the other input of NAND gate 126.

In a normal mode of operation, it is assumed that outputs Q and Qb of flip-flop 132 are at the inactive low and high logic levels respectively. Therefore the output of NAND gate 128 is at the high logic level. An active high logic level ACT[i] pulse causes IRCLK to be driven to the high logic level on the rising edge of an RCLK pulse while PRE[i] remains at the low logic level. The high logic level on the D input of flip-flop 132 is latched due to the feedback of IRCLK through NAND gates 128 and 130. The output of NAND gate 126 is driven to the high logic level due to the low logic level feedback of the Qb output of flip-flop 132. ACT[i] drops to the low logic level at the end of the pulse, causing inverter 124 to drive an input of NAND gate 127 to the high logic level. A high logic level PRE[i] signal causes NAND gate 127 to drive an input of NAND gate 128 to the low logic level, and NAND gate 128 drives an input of NAND gate 130 to the high logic level. With both its inputs at the high logic level, NAND gate 130 drives the D input of flip-flop 132 to a low logic level. IRCLK falls to the low logic level on the rising edge of a subsequent RCLK pulse. In short, the high logic level PRE[i] signal resets the circuit to its initial starting state on the rising edge of RCLK. In the turbo page mode of operation according to another embodiment of the present invention, PMODE is set to the high logic level to set all PRE[i] signals to the high logic level. The operation of internal row clock generator 122 is discussed in further detail in the description of the turbo page mode embodiment of the present invention.

As previously discussed, the row timing circuit of FIG. 6 determines when the bitline sense amplifiers 112 of FIG. 5 are activated after receiving memory access signal ACT[i]. Thus, activation of the column clock signals to latch column addresses at a precise time is required for turning on the column decoders as soon as the bitline sense amplifiers have settled. This precise timing is provided by the row timing emulator according to an embodiment of the present invention.

Figure 8:
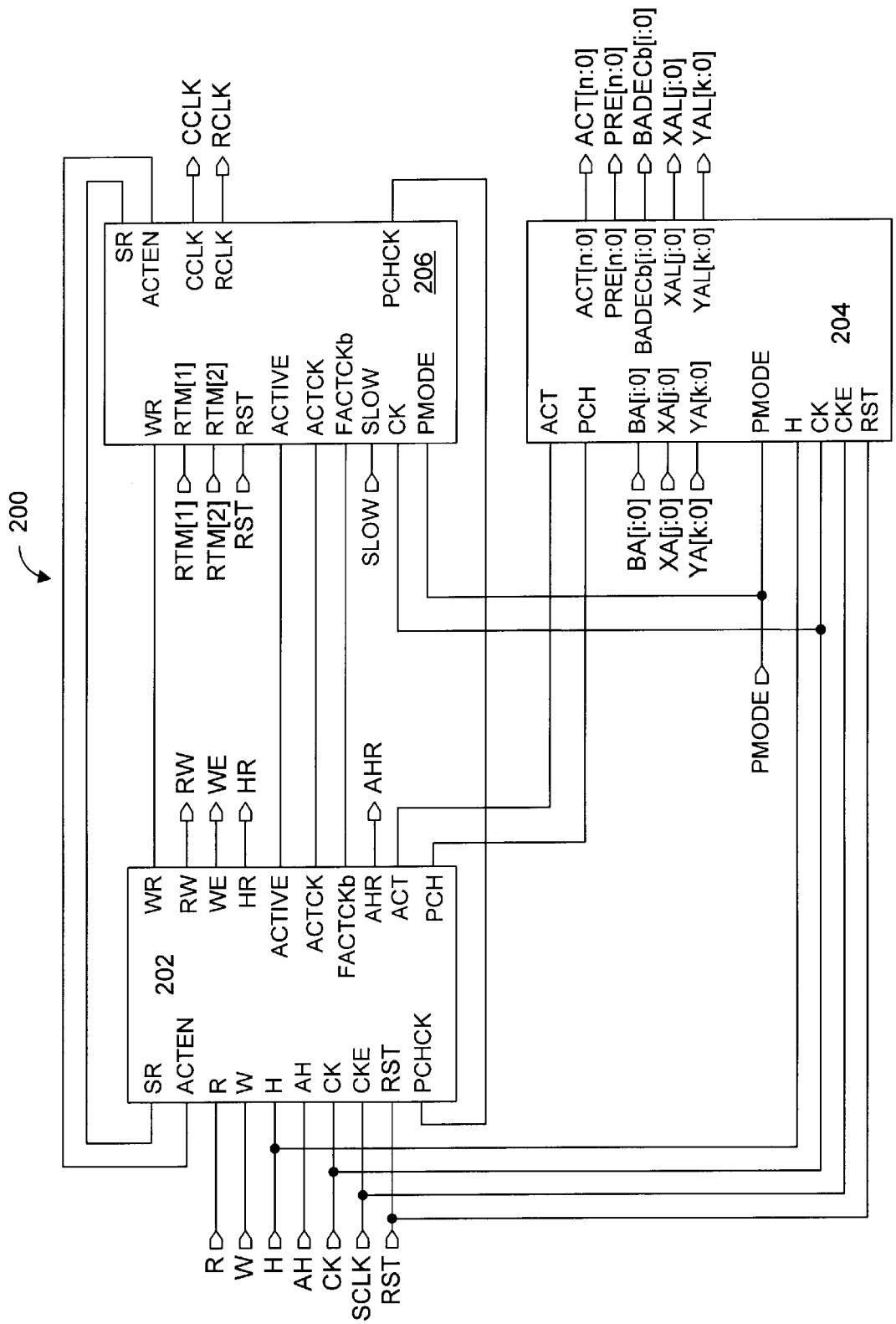
FIG. 8 is a block diagram of the SRAM interface of FIG. 3 according to an embodiment of the present invention.
Figure 9:
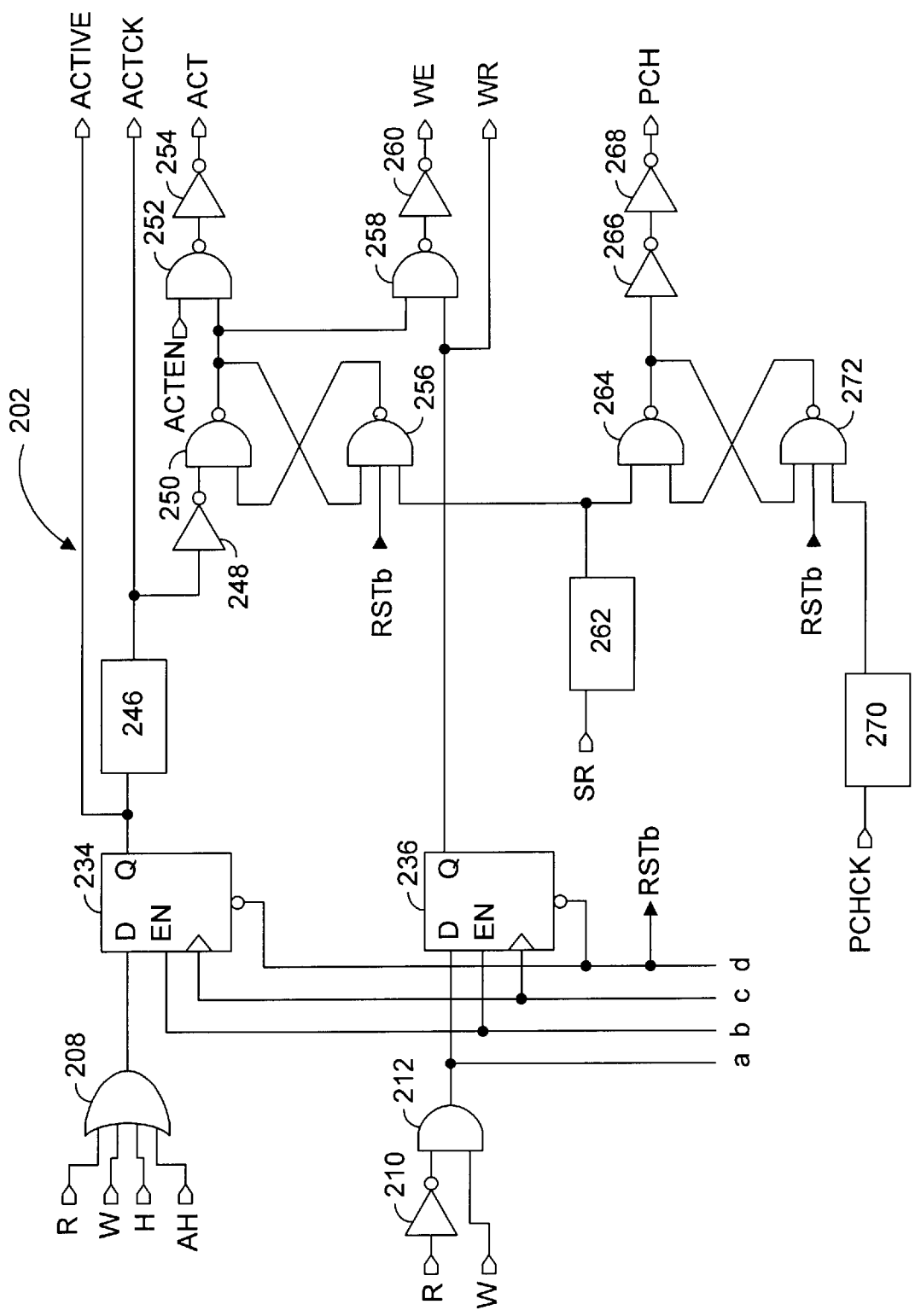
FIG. 9 shows a portion of the circuit schematic of the command decoder of FIG. 8.
Figure 10:
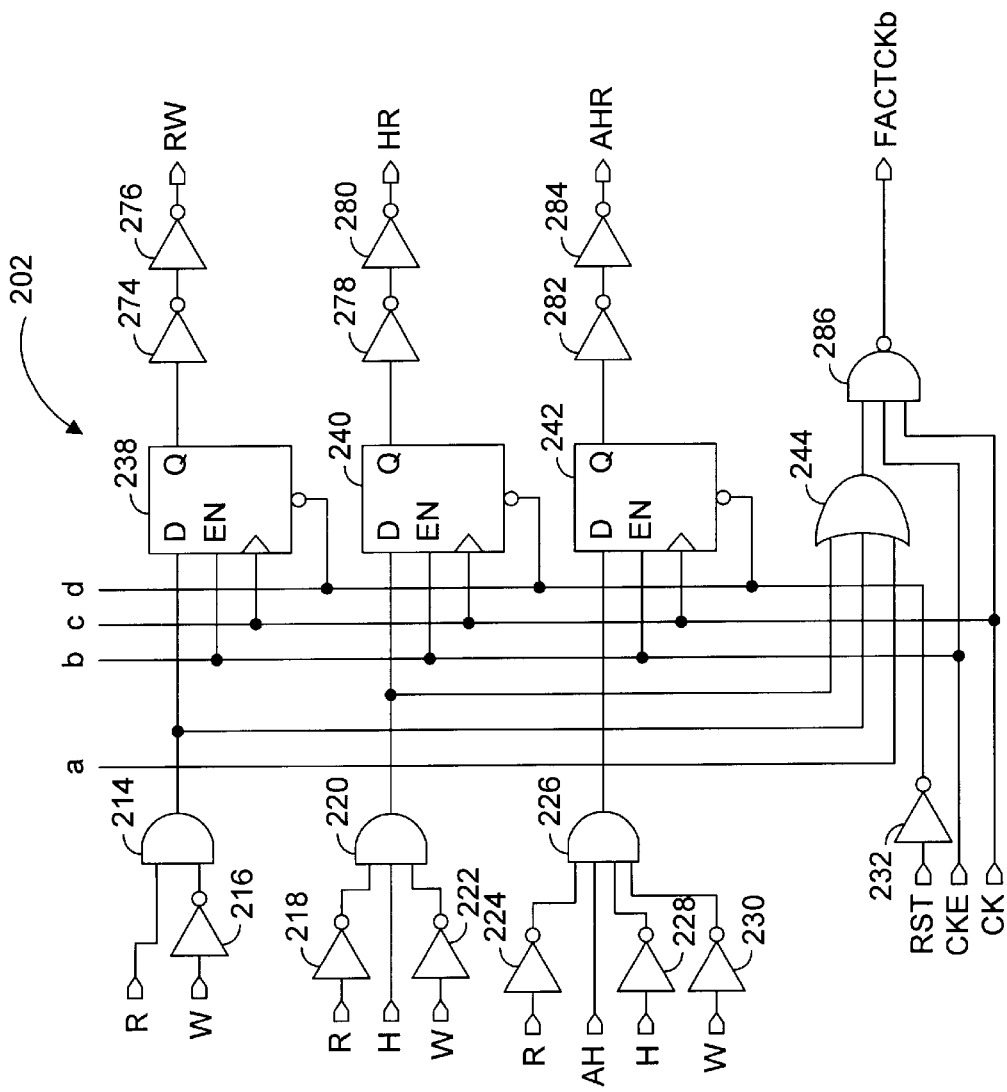
FIG. 10 shows a portion of the circuit schematic of the command decoder of FIG. 8.
Figure 11:
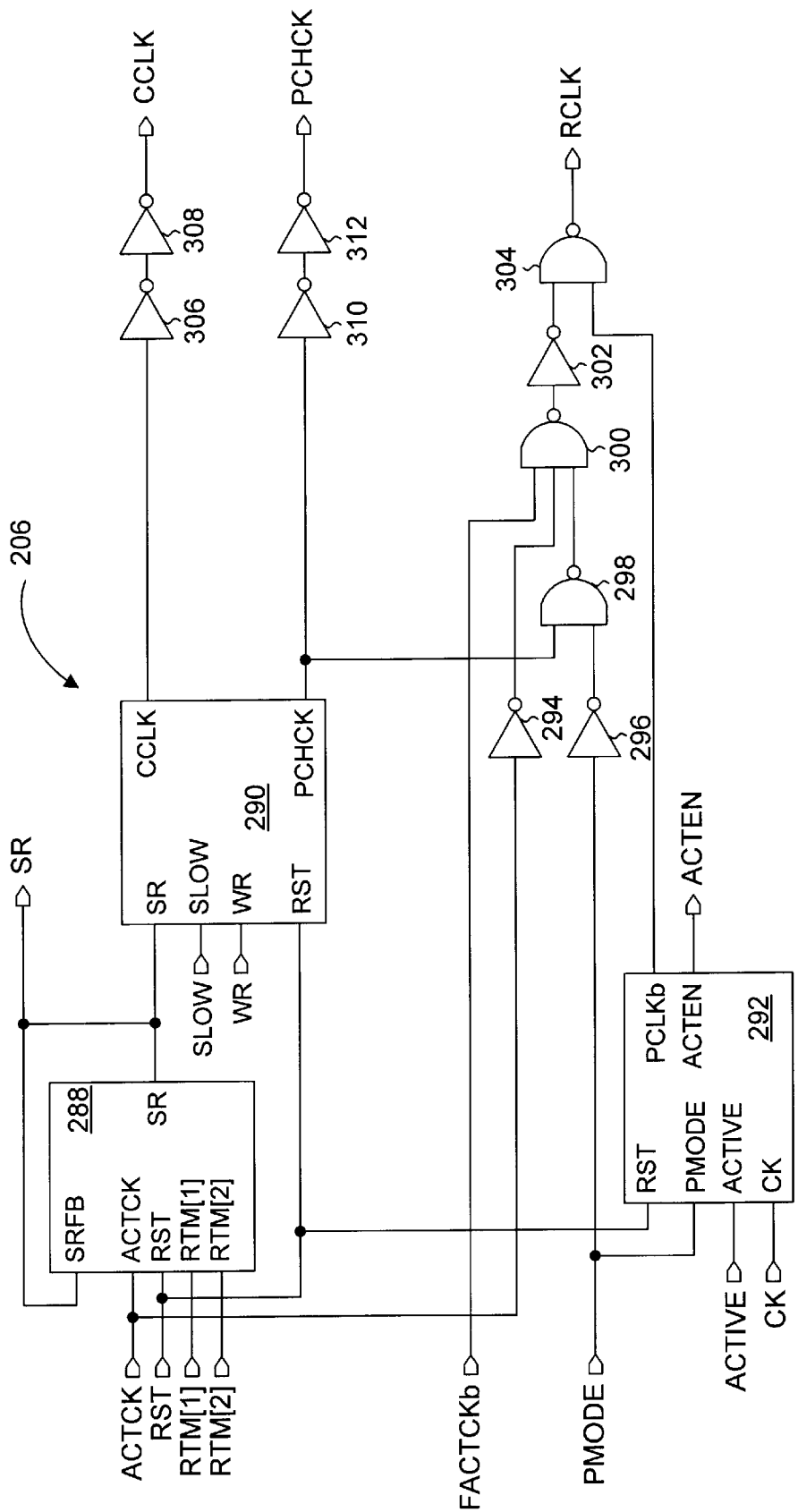
FIG. 11 is a block diagram of the clock sequencer of FIG. 8.
Figure 16:
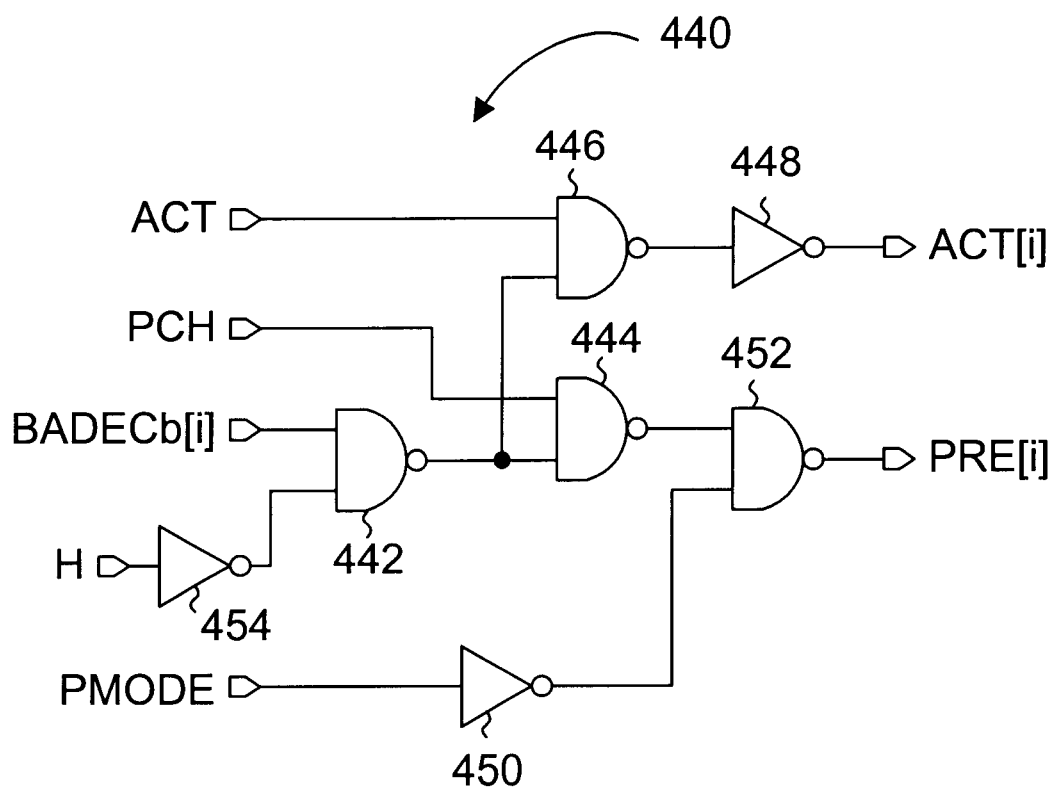
FIG. 16 is a circuit schematic of an activate and precharge circuit.

FIG. 8 is a block diagram of the SRAM interface shown in FIG. 3 according to an embodiment of the present invention. SRAM interface 200 is responsible for generating SDRAM control signals from system command signals, or SRAM control signals received from the system. SRAM interface 200 includes a command decoder 202, an address buffer 204 and clock sequencer circuit 206. In alternate embodiments, command decoder 202 is not included within SRAM interface 200 and can be represented as an individual block within the system. Command decoder 202 receives read signal R, write signal W, refresh signal H, auto refresh signal AH, system clock signal SCLK, clock enable signal CKE, and reset signal RST from the system, as well as emulated row timing signal SR, precharge clock PCHCK and ACT enable signal ACTEN from clock sequencer circuit 206. Command decoder 202 decodes its received signals to provide, read/write signal RW, registered write control signal WR, write enable signal WE, memory access signal ACTIVE, activation clock signal ACTCK, fast active clock pulse signal FACTCKb, memory access activate signal ACT, and precharge signal PCH. Address buffer 204 receives refresh signal H, clock signal SCLK, clock enable signal CKE, reset signal RST and page mode signal PMODE, bank addresses BA[i:0], row addresses XA[j:0] and column addresses YA[k:0] from the system. Address buffer 204 also receives signals ACT and PCH from command decoder 202 and provides memory activation signals ACT[n:0], memory precharge signals PRE[n:0], buffered bank addresses BADECb[i:0], buffered row addresses XAL [j:0] and buffered column addresses YAL[k:0]. Placeholder variables i, j, k and n are integers whose values depend upon the specific configuration desired by the designers. For example, a memory configuration could be designed such that i=3, j=5, k=3 and n=11. In the present embodiment, address buffer 204 receives multiplexed addresses, but in alternate embodiments of the SRAM interface 200, the address buffer 204 receives a linear address and converts it into a multiplexed address. Clock sequencer circuit 206 receives delay control signal SLOW, row timing adjustment signals RTM[1] and RTM[2], signals SCLK, RST and PMODE from the system as well as registered write control signal WR, ACTIVE, ACTCK and FACTCKb from command decoder 202. Clock sequencer 206 provides column clock signal CCLK, row clock signal RCLK, precharge clock signal PCHCK, emulated row timing signal SR and active enable signal ACTEN. Clock sequencer circuit 206 is responsible for activating the core memory circuits in preparation for memory access operations. Furthermore, clock sequencer circuit 206 ensures that the core memory circuits are activated with optimized timing. It is noted that the control signals shown in FIG. 8 are to help illustrate the general configuration of SRAM interface 200 and to simplify the schematic. Those of skill in the art will appreciate that additional signals are required to enable other SDRAM memory functions within the system, but are not relevant to the present invention and therefore not shown. Further details of command decoder 202 and clock sequencer circuit 206 are shown in FIGS. 9, 10 and 11. Address buffer 204 is a circuit that is well known in the art, and therefore does not require further discussion as it is not relevant to the present invention. However, an activate and precharge circuit located within address buffer 204 is shown in FIG. 16 for describing access operations to the SDRAM memory. Command decoder 202 and clock sequencer circuit 206 is described in further detail below.

The circuit details of command decoder 202 from FIG. 8 are shown in FIGS. 9 and 10. Command decoder 202 includes OR gate 208, AND gates 212, 214, 220 and 226 for decoding signals R, W, H and AH and the complement of R, W and H. OR gate 208 receives R, W, H and AH. AND gate 212 receives R via inverter 210 and R. AND gate 214 receives W via inverter 216 and R. AND gate 220 receives R via inverter 218, H and W via inverter 222. AND gate 226 receives R via inverter 224, AH, H via inverter 228 and W via inverter 230. The output of gates 208, 212, 214, 220 and 226 are connected to the D input of respective flip-flops 234, 236, 238, 240 and 242, and the outputs of AND gates 212, 214 and 220 are further connected to the inputs of OR gate 244. The enable inputs, clock inputs and reset inputs of all the flip-flops are connected to CKE, CK and the complement of RST, RSTb via inverter 232. The output of flip-flop 234 drives signal ACTIVE and is fed into rising edge positive pulse generator circuit 246. The output of pulse generator circuit 246 drives signal ACTCK and is also connected to the input of inverter 248. The output of inverter 248 is connected to cross-coupled NAND gates 250 and 256, also called the ACT latch circuit. NAND gate 256 also receives signal RSTb and the output of falling edge negative pulse generator circuit 262. The output of NAND gate 250 is connected to one input of NAND gates 252 and 258, and the output of NAND gates 252 and 258 are connected to inverters 254 and 260 respectively for driving signals ACT and WE. The other input of NAND gate 252 receives signal ACTEN and the other input of NAND gate 258 is connected to the Q output of flip-flop 236. The Q output of flip-flop 236 also drives the output terminal WR. Negative pulse generator circuit 262 receives signal SR, and its output is also connected to cross-coupled NAND gates 264 and 272, also called the PCH latch circuit. The output of NAND gate 264 is connected to a pair of series connected inverters 266 and 268. NAND gate 272 also receives signal RSTb and the output of falling edge negative pulse generator circuit 270, which receives signal PCHCK. Pairs of serially connected inverters 282 and 284 are connected to the output of flip-flops 238, 240 and 242 for driving signals RW, HR and AHR respectively. NAND gate 286 receives the output of OR gate 244, CKE and CK for driving signal FACTCKb.

In general operation, on the rising edge of CK, the decoded commands are latched in flip-flops 234, 236, 238, 240 and 242 as long as CKE is at the high logic level to enable the flip-flops. If a memory access is requested, the signal ACTIVE is driven to the high logic level. The rising edge of ACTIVE causes pulse generator 246 to generate a high logic level pulse. Since RSTb and the output of pulse generator 262 are at the high logic level, the high logic pulse from pulse generator 246 sets the ACT latch circuit comprising NAND gates 250 and 256. In other words, the output of NAND gate 250 is latched to the high logic level. Because ACTEN is at the high logic level, signal ACT is driven to the high logic level. Eventually, SR will fall to the low logic level and cause pulse generator 262 to generate a low logic level pulse. This low logic level pulse resets the ACT latch circuit to drive ACT to the low logic level, but also sets the PCH latch comprising NAND gates 264 and 272 such that PCH is driven to the high logic level. The PCH latch is reset by the falling edge of PCHCK. Signals RW, HR and AHR are generated in a straightforward manner, and signal FACTCKb is generated if a valid Read, Write or Refresh command is issued.

The clock sequencer circuit 206 of FIG. 11 includes a row timing emulator circuit 288, non-inverting margin delay circuit 290 and page mode control circuit 292. Row timing emulator circuit 288 receives signals ACTCK, RST, RTM[1] and RTM[2] and generates row timing signal SR that is fed back to its SR feedback input SRFB. Margin delay circuit 290 receives registered write control signal WR, delay control signal SLOW, signal RST and emulated row timing signal SR from row timing emulator circuit 288 for generating column clock signal CCLK buffered via inverters 306 and 308 and precharge clock signal PCHCK buffered via inverters 310 and 312. The PCHCK output of margin delay circuit 290 is connected to an input of NAND gate 298, while the other input of NAND gate 298 is connected to signal PMODE via inverter 296. The output of NAND gate 298 is connected to one input of NAND gate 300. The second and third inputs of NAND gate 300 are connected to signals ACTCK via an inverter 294 and FACTCKb respectively. The output of NAND gate 300 is connected to an input of NAND gate 304 via an inverter 302, and the other input of NAND gate 304 is connected to page mode precharge clock signal output PCLKb of page mode control circuit 292. The output of NAND gate 304 drives row clock signal RCLK. Inverters 294, 296 and 302, and NAND gates 298, 300 and 304 form a clock mixer circuit that combines the various clock input signals to generate the single row clock RCLK. The page mode control circuit 292 and the clock mixer circuit form a clock combiner circuit. Page mode control circuit 292 receives signals RST, PMODE, ACTIVE and CK for providing signals PCLKb and ACTEN.

The general functions of row timing emulator circuit 288, margin delay circuit 290 and page mode control circuit 292 are now described. Row timing emulator circuit 288 mimics the delay in activating the sense amplifier control signal SAON from row timing control circuit 120 of FIG. 6 in response to a memory access signal. Therefore, signal SR will become active at the same time as signal SAON of FIG. 6 after a memory access signal, such as activation clock signal ACTCK is received. Margin delay circuit 290 permits the system designer to customize the delayed activation of clock signal CCLK and PCHCK during read and write operations. This particular feature is discussed later with reference to FIGS. 13 and 14. Page mode control circuit 292 permits rapid access to the SDRAM memory according to the turbo page mode embodiment of the present invention, and is discussed in further detail with reference to FIG. 15. NAND gates 298, 300 and 304 receive control signals from the other circuit blocks to generate row clock signal RCLK, which is used for latching the row address signals and initiating activation of the sense amplifiers through the row timing circuits 120 shown in FIG. 6. Hence, clock sequencer circuit generates an active CCLK signal for latching column addresses when the sense amplifiers have latched the bitline data, or at a time shortly after as determined by the delay provided by margin delay circuit 290.

Figure 12:
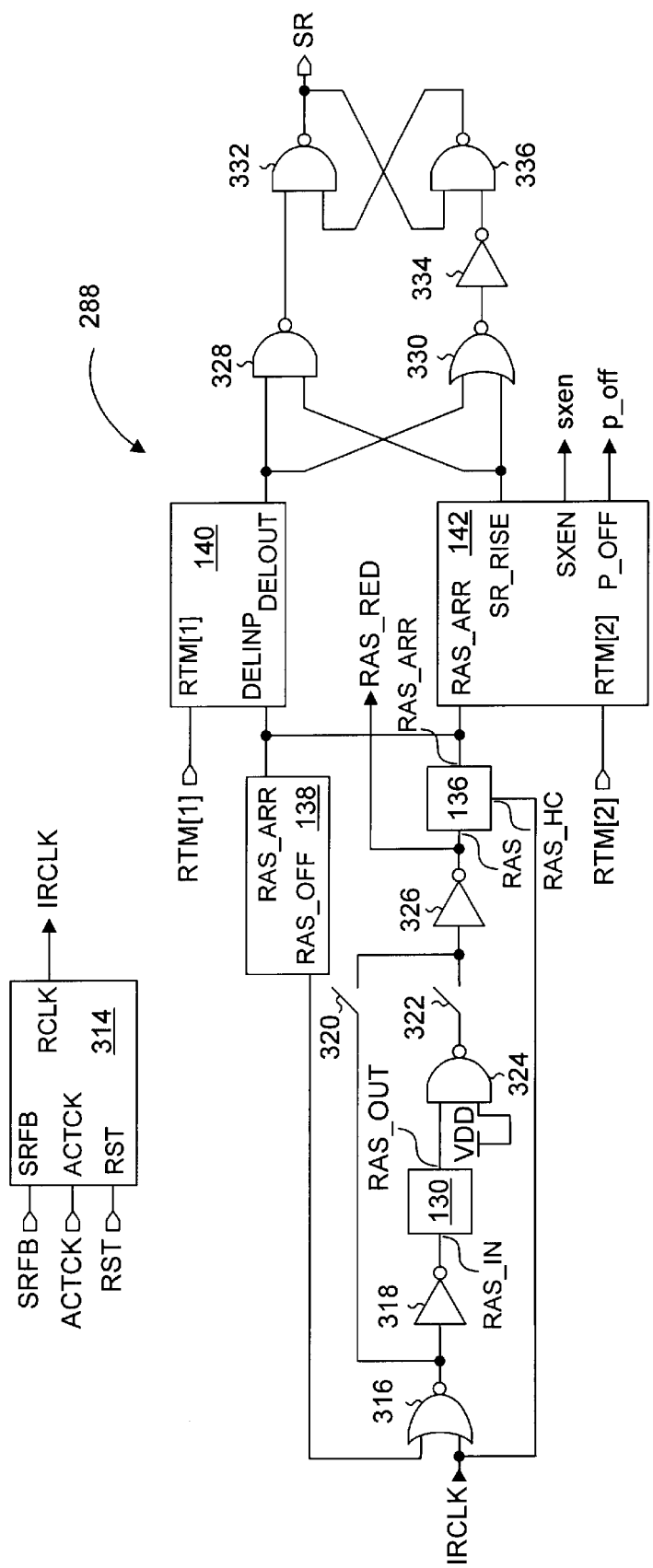
FIG. 12 is a schematic of the row emulator circuit of FIG. 11.

FIG. 12 is a schematic of row timing emulator circuit 288. The configuration of the row timing emulator circuit 288 is substantially identical to that of row timing circuit 120 of FIG. 6, except for the circuits that generate the respective internal row clock signals IRCLK. Row timing emulator circuit 288 includes an internal row clock generator 314, non-inverting RAS margin delay circuit 130, non-inverting RAS delay circuit 136, non-inverting RAS fall delay circuit 138, non-inverting SR fall delay circuit 140, and non-inverting SR rise generator circuit 142. These aforementioned circuit blocks are not shared between the row timing circuit 120 and row timing emulator circuit 288, but illustrate that row timing emulator circuit 288 has circuit blocks that are substantially identical to those same numbered circuit blocks of row timing circuit 120. Row clock generator 314 receives SR feedback signal SRFB, activation clock signal ACTCK and reset signal RST for providing internal row clock signal IRCLK. IRCLK is connected to one input of NOR gate 316 and the RAS-HC input of RAS delay circuit 136. The other input of NOR gate 316 is connected to the RAS_OFF output of RAS fall delay circuit 138. The output of NOR gate 316 is connected to the RAS_IN input of RAS margin delay circuit 130 via inverter 318. The RAS_OUT output of RAS margin delay circuit 130 is connected to an input of NAND gate 324. The other input of NAND gate 324 is directly connected to the voltage supply VDD, and its output is connected to the RAS input of RAS delay circuit 136 via inverter 326. In row timing circuit 120 of FIG. 6, NAND gate 324 receives signal RCLKEN[i], a block decoded signal. However row timing emulator 288 is activated in each read and write operation, hence it is always enabled. Row timing emulator circuit 288 includes a wiring option to effectively remove inverter 318, RAS margin delay circuit 130 and NAND gate 324 from the circuit during manufacturing of the device. This wiring option is depicted as a pair of complementary switches 320 and 322. If switch 320 is closed, the output of NOR gate 316 is connected directly to the input of inverter 326 and switch 322 remains open to isolate the output of NAND gate 324. Conversely, if switch 320 is open, switch 322 is closed. This bypass feature allows the system designer to remove delay from the row timing emulator 288. The RAS_ARR output of RAS delay circuit 136 is connected to the RAS_ARR input of SR rise generator circuit 142, the RAS ARR input of RAS fall delay circuit 138 and the DELINP input of SR fall delay circuit 140. SR fall delay circuit 140 also receives signal RTM[1]. The output DELOUT of SR fall delay circuit 140 is connected to an input of NAND gate 328 and NOR gate 330. The other input of NAND gate 328 and NOR gate 330 is connected to the output SR_RISE of SR rise generator circuit 142. SR rise generator circuit 142 also receives signal RTM[2], and provides dummy SXEN signal sxen and dummy P OFF signal p_off. Signals sxen and p_off in this circuit are left open, and thus does not have any function. Signals RTM[1] and RTM[2] are the same signals used in FIG. 6 for adjusting the row timing delay. The output of NAND gate 328 is connected to an input of NAND gate 332 and the output of NOR gate 330 is connected to an input of NAND gate 336 via inverter 334. NAND gates 332 and 336 are arranged in a cross-coupled configuration such that the output of NAND gate 332 is connected to the other input of NAND gate 336 and the output of NAND gate 336 is connected to the other input of NAND gate 332. Signal SR is driven by the output of NAND gate 332. Because circuit blocks 130, 136, 138, 140 and 142 are designed to be the same circuit blocks that are used in the row timing circuit of FIG. 6, row timing emulator 288 will provide an active SR signal at the same time or later than activation of signal SAON from the row timing circuit 120.

Since row timing emulator 288 includes circuits substantially identical to the normal row timing circuit 120 for emulating the row timing, the column clock circuits can be activated as soon as the sense amplifiers are turned on to minimize the access time and maximize memory performance. In a preferred embodiment, the physical layout of the components of the row timing emulator circuit is substantially identical to that of the row timing circuit to further ensure accurate matching of delays. There are various circuits that can be tailored to simulate the delay of the row timing circuit, however their delays will not always match those in the row timing circuit. For example, changes in operating temperature will affect the delay in the row timing circuit and the simulated delay circuit in different ways, such that their delays are no longer matched. However, because the row timing emulator according to the embodiment of the present invention uses row timing emulator 288, temperature changes will equally affect operation of both the row timing circuit and the dummy row timing circuit.

Margin delay circuit 290 of FIG. 11 selectively delays the generation of column clocks CCLK and PCHCK after receiving an active SR signal generated by row timing emulator 288 depending on the memory access operation being executed. For example, additional delay in generation of the column clock signals may be desired during read access operations because time is required for the bitline voltage levels to settle and the sense amplifiers to latch. On the other hand, write access operations can be executed quickly because data is written directly into the sense amplifiers for transfer into a selected SDRAM cell. A circuit schematic of margin delay circuit 290 shown in FIGS. 13 and 14 is described below.

Figure 13:
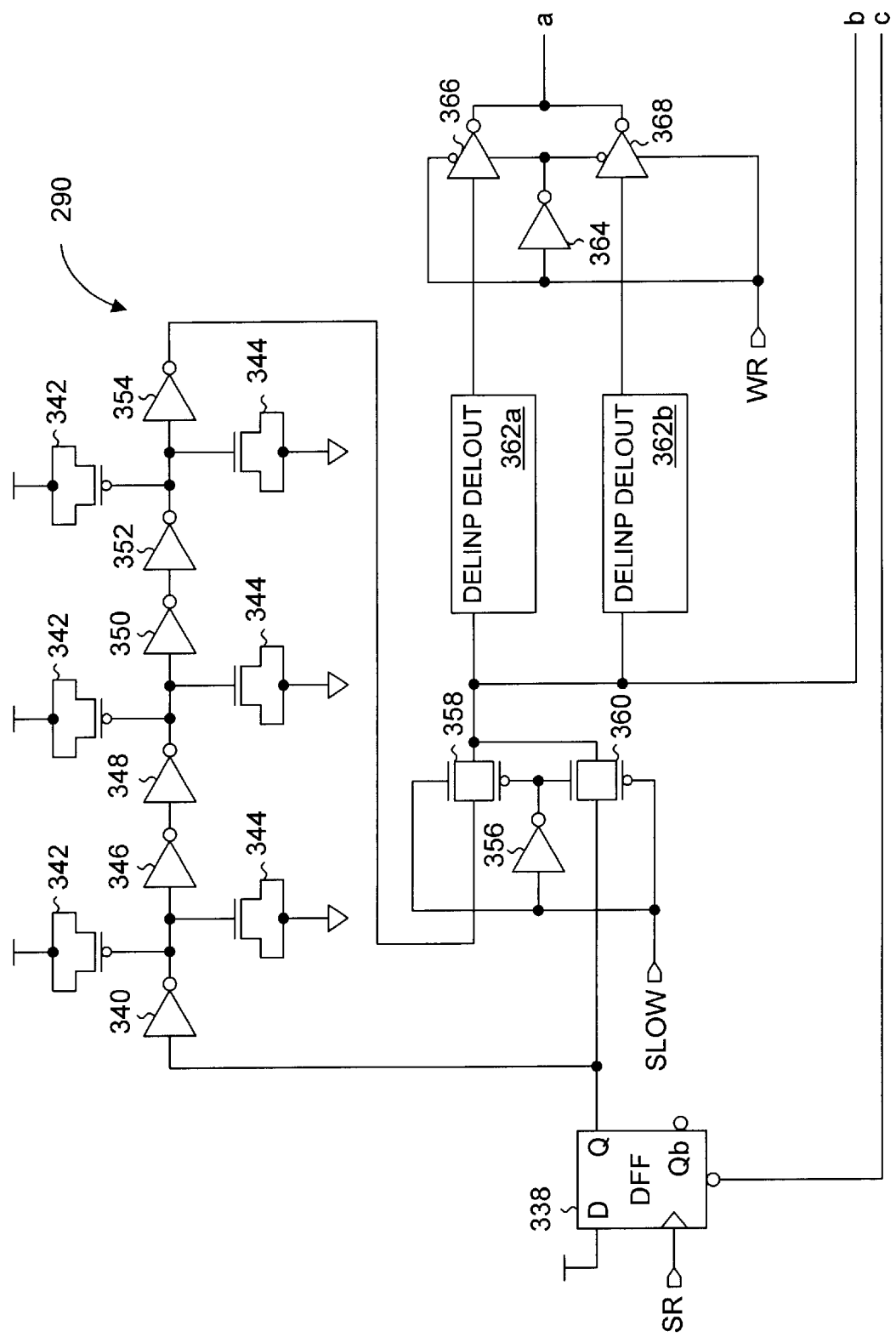
FIG. 13 shows a portion of the circuit schematic of the column clock delay circuit of FIG. 11.
Figure 14:
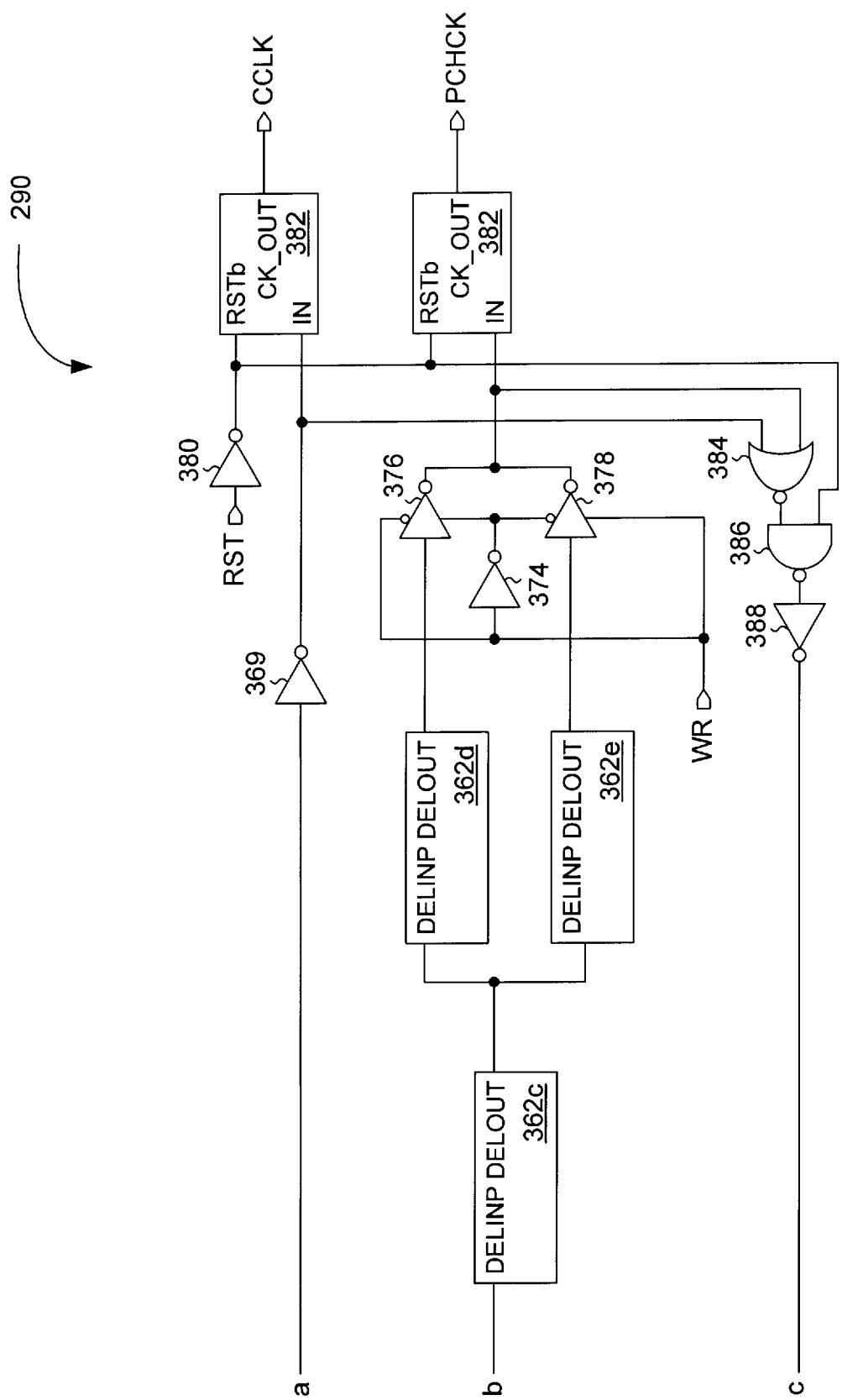
FIG. 14 shows a portion of the circuit schematic of the column clock delay circuit of FIG. 11.

FIGS. 13 and 14 show a circuit schematic of the margin delay circuit 290 shown in FIG. 11. Margin delay circuit 290 generates a CCLK pulse in response to the row timing emulator 288 of FIG. 11 and automatically generates a PCHCK pulse for precharging the SDRAM memory at a delayed time after generation of the CCLK pulse. Margin delay circuit is programmable to permit system designers to tailor the generation of CCLK and PCHCK according to the specifications of their system. Furthermore, CCLK and PCHCK are generated at different times for read and write operations. Time is required for the bitline sense amplifiers to latch the bitline data during read operations, hence CCLK is generated after the data is latched. On the other hand, data from the system is quickly driven to the bitline sense amplifiers in write operations, thus CCLK can be generated earlier than in read operations. A flip-flop 338 has the SR input terminal connected to its clock input, VDD connected to its D input, and the output of inverter 388 connected to its reset input. The Q output of flip-flop 338 is connected to the input terminal of transmission gate 360 and the input of inverter 340. Serially connected inverters 340, 346, 348, 350, 352 and 354, and PMOS capacitors 342 and NMOS capacitors 344 form a delay chain where the output of inverter 354 is connected to the input terminal of transmission gate 358. The n-channel gate of transmission gate 358 and the p-channel gate of transmission gate 360 are connected to input terminal SLOW. The p-channel gate of transmission gate 358 and the n-channel gate of transmission gate 360 are connected to the output of inverter 356, whose input is connected to input terminal SLOW. The output terminals of transmission gates 358 and 360 are connected in common and received by a delay circuit 362*a*. The output of delay circuit 362*a* is connected to the input of tri-state inverter 366. The output terminals of transmission gates 358 and 360 are also received by a delay circuit 362*b*. The output of delay circuit 362*b* is connected to the input of tri-state inverter 368. The p-channel input of tri-state inverter 366 and the n-channel input of tri-state inverter 368 is connected to the WR input terminal. The n-channel input of tri-state inverter 366 and the p-channel input of tri-state inverter 368 is connected to the output of inverter 364, whose input is connected to the WR input terminal. The common output terminal of tri-state inverters 366 and 368 is connected to the IN input of a first clock generator circuit 382 via inverter 369. The first clock generator 382 drives the CCLK terminal through its CK_OUTb output. The common output terminal of transmission gates 358 and 360 is also connected to delay circuit 362*c*, and the output of delay circuit 362*c* is connected to delay circuits 362*d* and 362*e*. The output of delay circuit 362*d* is connected to the input of tri-state inverter 376, and the output of delay circuit 362*e* is connected to the input of tri-state inverter 378. The p-channel input of tri-state inverter 376 and the n-channel input of tri-state inverter 378 is connected to input terminal WR. The n-channel input of tri-state inverter 376 and the p-channel input of tri-state inverter 378 is connected to the output of inverter 374, whose input is connected to input terminal WR. The common output terminal of tri-state inverters 376 and 378 is connected to the IN input of second clock generator circuit 382. The second clock generator 382 drives the PCHCK terminal through its CK_OUTb output. The first and second clock generator circuits 382 are both connected to the RST input terminal at their respective RSTb input via inverter 380. NOR gate 384 receives the output of inverter 369 and the common terminal of tri-state inverters 376 and 378 for driving an input of NAND gate 386. NAND gate 386 has its other input connected to the output of inverter 380 for driving the input of inverter 388.

The general functions of the components of margin delay circuit 290 are now described. From the reset state, the rising edge of SR causes flip-flop 338 to drive a high logic level signal from its Q output. Transmission gates 358 and 360 are arranged to perform a multiplexing function for passing the Q output directly from flip-flop 338 or the delayed Q output from the inverter-capacitor delay chain. The delayed Q output is passed when signal SLOW is at the high logic level, and conversely, the Q output from flip-flop 338 is passed when signal SLOW is at the low logic level. The circuits between the common output terminal of transmission gates 358 and 360, and the first clock generator circuit 382 form the CCLK generation path. The circuits between the common output terminal of transmission gates 358 and 360, and the second clock generator circuit 382 form the PCHCK generation path. NOR gate 384, NAND gate 386 and inverter 388 form the flip-flop 338 reset feedback path. The first clock generator circuit 382 generates a high logic level CCLK pulse in response to a high logic level signal received at its IN input. Delay circuits 362*a* and 362*b* provide different delay of the signal passed by transmission gates 358 and 360. In this particular example, the delay through delay circuit 362*a* is the read delay, and thus longer than the write delay provided by delay circuit 362*b*. Tri-state inverters 366 and 368 are arranged to perform a multiplexing function for passing the output of either delay circuit 362*a* or 362*b*. In this particular embodiment, the output of delay circuit 362*b* is passed only when WR is at the high logic level. Otherwise, the output of delay circuit 362*a* is passed. The common output terminal of tri-state inverters 366 and 368 is further delayed by delay circuit 362*c*. Delay circuits 362*d* and 362*e* provide different delay of the signal provided at the DELOUT output of delay circuit 362*c*. In this particular example, the delay through delay circuit 362*d* is the read delay, and thus longer than the write delay provided by delay circuit 362*e*. The read delay path is longer to provide sufficient time for the bitline sense amplifiers to sense the data of the bitlines. Tri-state inverters 376 and 378 are arranged to perform a multiplexing function for passing the output of either delay circuit 362*d* or 362*e*. In this particular embodiment, the output of delay circuit 362*d* is passed when WR is at the low logic level. Otherwise, the output of the delay circuit 362*e* is passed. The second clock generator circuit 382 generates a high logic level PCHCK pulse in response to a high logic level signal received at its IN input. The reset feedback path resets flip-flop 338 when either the first or second clock generator circuit 382 receives a high logic level signal on its IN input, or when RST rises to the high logic level. Signal SLOW is not used in normal operations of the interface circuit, and is used for slowing the generation of CCLK and PCHCK for ease of testing.

According to another embodiment of the present invention, the SRAM interface includes circuits for providing a modified page mode access to the embedded DRAM called turbo page mode. According to the previously described embodiment of the present invention, access to one row of a memory bank involves three different phases. With reference to the timing diagram of FIG. 4, a row clock phase involves activation of row clock RCLK, a column clock phase involves activation of column clock CCLK and the precharge clock phase involves activation of precharge clock PCHCK to precharge the bitlines of the accessed memory bank. For example, if the row, column and precharge clock phases require 4 ns, 2 ns and 2 ns respectively, then the embedded SDRAM can operate at a frequency of 125 MHz. The turbo page mode embodiment of the present invention improves the memory access speed by concurrently executing the precharge clock phase of a previous access cycle with the row clock phase of the subsequent access cycle. Therefore each access cycle is reduced to 6 ns, increasing the frequency of the embedded memory to 166 MHz. Furthermore, if there is no operation to be executed on the embedded SDRAM in a cycle subsequent to an access cycle, all memory banks are automatically precharged. The circuits responsible for controlling the SDRAM in turbo page mode are shown in FIGS. 15 and 16.

Figure 15:
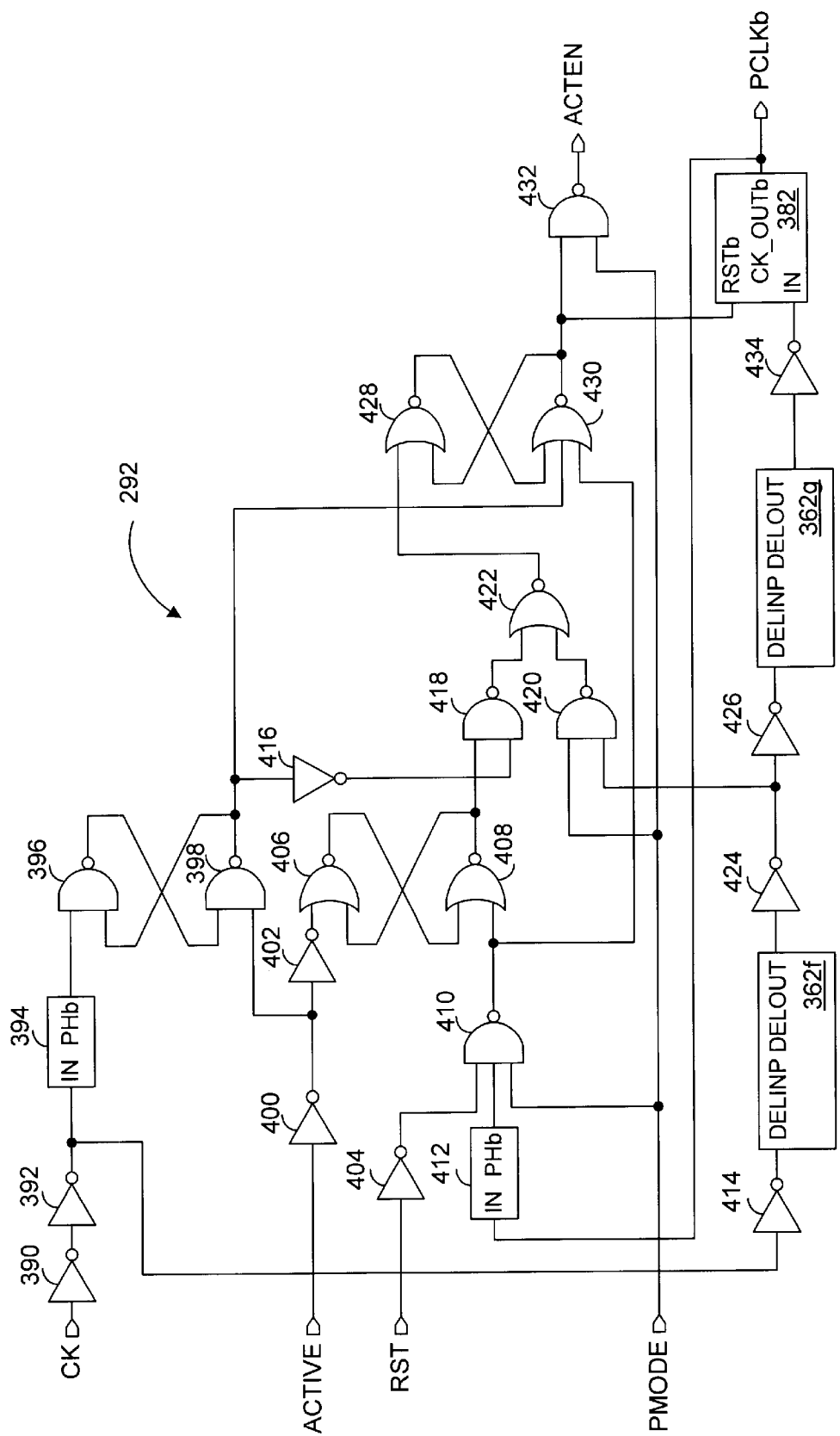
FIG. 15 is a circuit schematic of the page mode control circuit of FIG. 11.

FIG. 15 is a circuit schematic of the page mode control circuit 292 shown in FIG. 11. This circuit is responsible for detecting a no operation cycle after an access cycle to the embedded DRAM during the turbo page mode embodiment of the present invention, for precharging all banks of the embedded memory. Page mode control circuit 292 receives signals PMODE, RST, ACTIVE and CK, for generating signals PCLKb and ACTEN. In summary, page mode control circuit 292 generates a low logic level PCLKb pulse in a non-active cycle immediately following an active cycle, such as a read or write operation for example, during turbo page mode operation. The low logic level PCLKb pulse causes RCLK to pulse to the high logic level. Page mode control circuit 292 includes an inverter 390 having an input connected to system clock signal CK and an output connected to the input of inverter 392. The output of inverter 392 is connected to a first pulse delay circuit 394 and to the input of inverter 414. A delay circuit 362f, inverter 424, inverter 426, and a delay circuit 362g are serially connected between the output of inverter 414 and the input of inverter 434. A clock circuit 382 has its IN input connected to the output of inverter 434, a RSTb input connected to the output of NOR gate 430, and a CK_OUTb output for driving signal PCLKb and the input of a second pulse delay circuit 412. First and second delay circuits are identical to each other, and generate a low logic level pulse upon receiving a high logic level on its IN input. The output of first pulse delay circuit 394 is connected to an input of NAND gate 396, which is arranged in a cross-coupled configuration with NAND gate 398. Signal ACTIVE is connected to the input of inverter 400, whose output is connected to the other input of NAND gate 398 and the input of inverter 402. The output of inverter 402 is connected to an input of NOR gate 406, which is arranged in a cross-coupled configuration with NOR gate 408. The other input of NOR gate 408 is connected to the output of NAND gate 410, which receives RST via inverter 404, PMODE and the output of second pulse delay circuit 412. The output of NOR gate 408 is connected to an input of NAND gate 418, and the other input of NAND gate 418 is coupled to the output of NAND gate 398 via inverter 416. The output of NAND gate 418 is connected to an input of NOR gate 422, who's other input is connected to the output of NAND gate 420. One input of NAND gate 420 is connected to PMODE and its other input is connected to the output of inverter 424. The output of NOR gate 422 is connected to an input of NOR gate 428, which is arranged in a cross-coupled configuration with NOR gate 430. NOR gate 430 has a second input connected to the output of NAND gate 398 and a third input connected to the output of NAND gate 410. The output of NOR gate 430 is connected to an input of NAND gate 432, which receives PMODE at its other input. The output of NAND gate 432 drives signal ACTEN.

In general operation, PMODE is set to the low logic level to control the embedded SDRAM in non-page mode operation. When PMODE is at the low logic level, NAND gate 432 drives ACTEN to the high logic level, thus allowing ACT to be generated from command decoder 202 at any time. The low logic level PMODE signal also propagates through NAND gate 410 and NOR gate 430 to drive the RSTb input of clock circuit 382 to the low logic level, keeping PCLKb at the high logic level. When PMODE is set to the high logic level, the embedded DRAM is operated in turbo page mode. In any active cycle, ACTIVE is driven to the high logic level to set the output of NAND gate 398 to the high logic level. Since the output of NAND gate 410 remains at the low logic level while PCLKb remains at the high logic level, cross coupled NOR gates 406 and 408 latch the high logic level of ACTIVE. Because the output of NAND gate 398 is set to the high logic level, NOR gate 430 is set to the low logic level. The low logic level output of NOR gate 430 causes ACTEN to be driven to the high logic level and PCLKb to be driven to the high logic level. Hence the logic levels of ACTEN and PCLKb are no different than in non-page mode operation. If ACTIVE remains at the low logic level on the rising edge of CK, such as in the case when no commands are received by command decoder 200 for example, the output of NAND gate 398 is latched to the low logic level. The low logic level ACTIVE signal has no effect upon cross-coupled NOR gates 406 and 408. Now the inputs of NAND gate 418 are both at the high logic level. Eventually the rising edge of CK reaches the input of NAND gate 420, and all the inputs of NAND gates 418 and 420 will be at the high logic level. Therefore, both inputs of NOR gate 422 are driven to the low logic level and an input of NOR gate 428 is driven to the high logic level. The output of NOR gate 430 is eventually latched to the high logic level and ACTEN is driven to the low logic level. Since the RSTb input of clock circuit 382 is raised to the high logic level, clock circuit 382 is allowed to generate a low logic level PCLKb pulse. The low logic level PCLKb pulse then drives RCLK to the high logic level for the duration of the PCLKb pulse in FIG. 11. The low logic level PCLKb pulse is eventually received by NAND gate 410 to drive the input of NOR gate 408 to the high logic level for resetting cross-coupled NOR gates 406 and 408.

Details of address buffer 204 from FIG. 8 are not shown because most of its circuits and functions are not relevant to the present invention. However, an activate and precharge circuit typically found within address buffer 204 is used in the turbo page mode embodiment of the present invention. In particular, the activate and precharge circuit generates predecoded ACT[i] and PRE[i] signals used by internal row clock generator 122 of row timing circuits 120. The circuit schematic of the active and precharge circuit is shown in FIG. 16.

FIG. 16 is a circuit schematic of an activate and precharge circuit for generating decoded activate and precharge signals from decoded bank addresses. In the present embodiment, activate and precharge circuit 440 is a circuit located within address buffer 204 shown in FIG. 8. Activate and precharge circuit 440 receives a decoded bank address BADECb[i] at an input of NAND gate 442 and a refresh signal H at its other input via inverter 454. The output of NAND gate 442 is connected to an input of NAND gate 444 and an input of NAND gate 446. The other input of NAND gate 444 is connected to precharge signal PCH. The other input of NAND gate 446 is connected to activate signal ACT, and its output is connected to the input of inverter 448. The output of NAND gate 444 is connected to an input of NAND gate 452, and the other input of NAND gate 452 is connected to page mode signal PMODE via inverter 450. The output of NAND gate 452 drives decoded precharge signal PRE[i], and the output of inverter 448 drives decoded activate signal ACT[i]. There is exactly one activate and precharge circuit 440 for each decoded bank address signal BADECb[i], where i can be any non-zero integer value. Signals ACT, PCH, H and PMODE are common to each activate and precharge circuit 440. Signals ACT[i] and PRE[i] are coupled to corresponding row timing circuits, such as row timing circuits 120 from FIG. 6. Activate signal ACT becomes active at the high logic level when any memory operation, such as a read or write operation, is executed, and precharge signal PCH becomes active at the high logic level when a precharge operation is executed. Refresh signal H becomes active at the high logic level when the memory is to be refreshed.

Generally, activate and precharge circuit 440 provides decoded ACT [i] and PRE [i] signals to row timing circuits 120 during normal access operations. In turbo page mode, PMODE is driven to the high logic level to set all PRE[i] signals to the high logic level. The operation of the row timing circuit 120 of FIG. 6, page mode control circuit 292 of FIG. 15 and activate and precharge circuit 440 of FIG. 16 is described in detail later.

A description of the component blocks of row timing circuit 120 of FIG. 6 and row timing emulator 288 of FIG. 12 now follows. As previously mentioned, the component blocks of row timing emulator 288 are substantially identical to the same numbered component blocks of row timing circuit 120.

Figure 17:
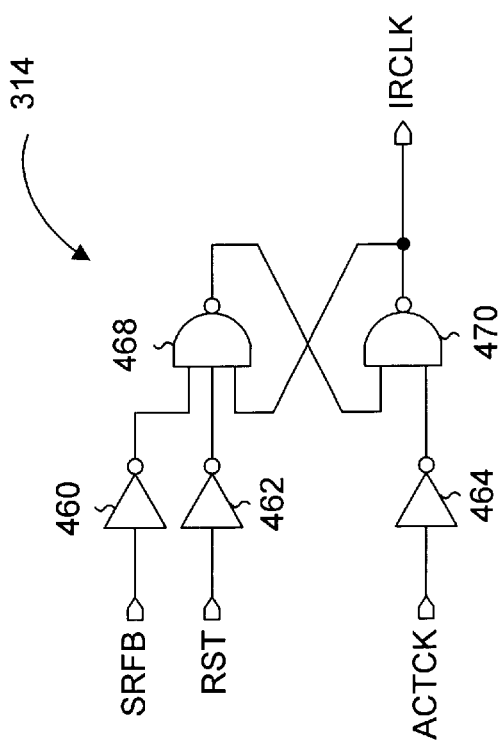
FIG. 17 is a circuit schematic of the internal row clock generator circuit of FIG. 12.

FIG. 17 shows a circuit schematic of the row clock generator circuit 314 in row timing emulator 288. The circuit includes NAND gates 468 and 470 connected in a cross-coupled configuration. NAND gate 468 receives SR feedback signal SRFB and reset signal RST via inverters 460 and 462 respectively. NAND gate 470 receives signal ACTCK via inverter 464 and provides the internal row clock signal IRCLK. In general operation, IRCLK will be driven and latched at the high logic level when a high logic level ACTCK pulse is received. If either SR feedback signal SRFB or reset signal RST rises to the high logic level, then the cross-coupled latch circuit resets and IRCLK falls to the low logic level.

Figure 18:
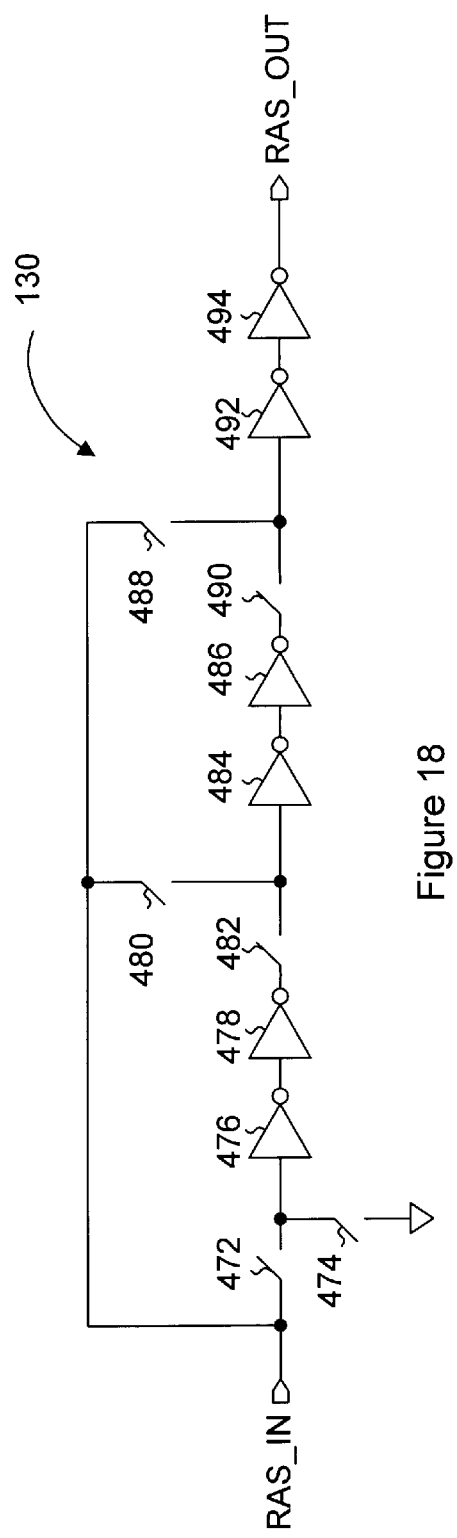
FIG. 18 is a circuit schematic of the RAS margin delay circuit of FIG. 12.

FIG. 18 shows a circuit schematic of the RAS margin delay circuit 130 from FIGS. 6 and 12. This circuit includes two pairs of cascaded delay inverters 476/478 and 484/486, and a pair of cascaded driving inverters 492/494. The circuit also includes three wiring options that are appropriately placed to enable bypass of either one or both pairs of cascaded delay inverters. Each wiring option is depicted as a pair of complementary switches, such as switch pair 472/474 for example. Those of skill in the art would understand that if one switch is open, then its complementary switch is closed. The common terminals of switch pairs 472/474, 480/482 and 488/490 are connected to the inputs of inverters 476, 484 and 492 respectively. The other terminal of switches 482 and 490 are connected to the output of inverters 478 and 486 respectively, and the other terminal of switch 474 is connected to ground. Input terminal RAS_IN is connected to the other terminal of switches 472, 480 and 488, and output terminal RAS_OUT is driven by inverter 494. Depending on the system design specifications, either one or both pairs of cascaded delay inverters can be selectively bypassed with the wiring options. Specifically, the signal appearing on output terminal RAS_OUT can be delayed by up to an additional four inverter transition delays. Those of skill in the art will understand that certain combinations of switch configurations are invalid, resulting in a malfunctioning circuit, and would therefore be avoided.

Figure 19:
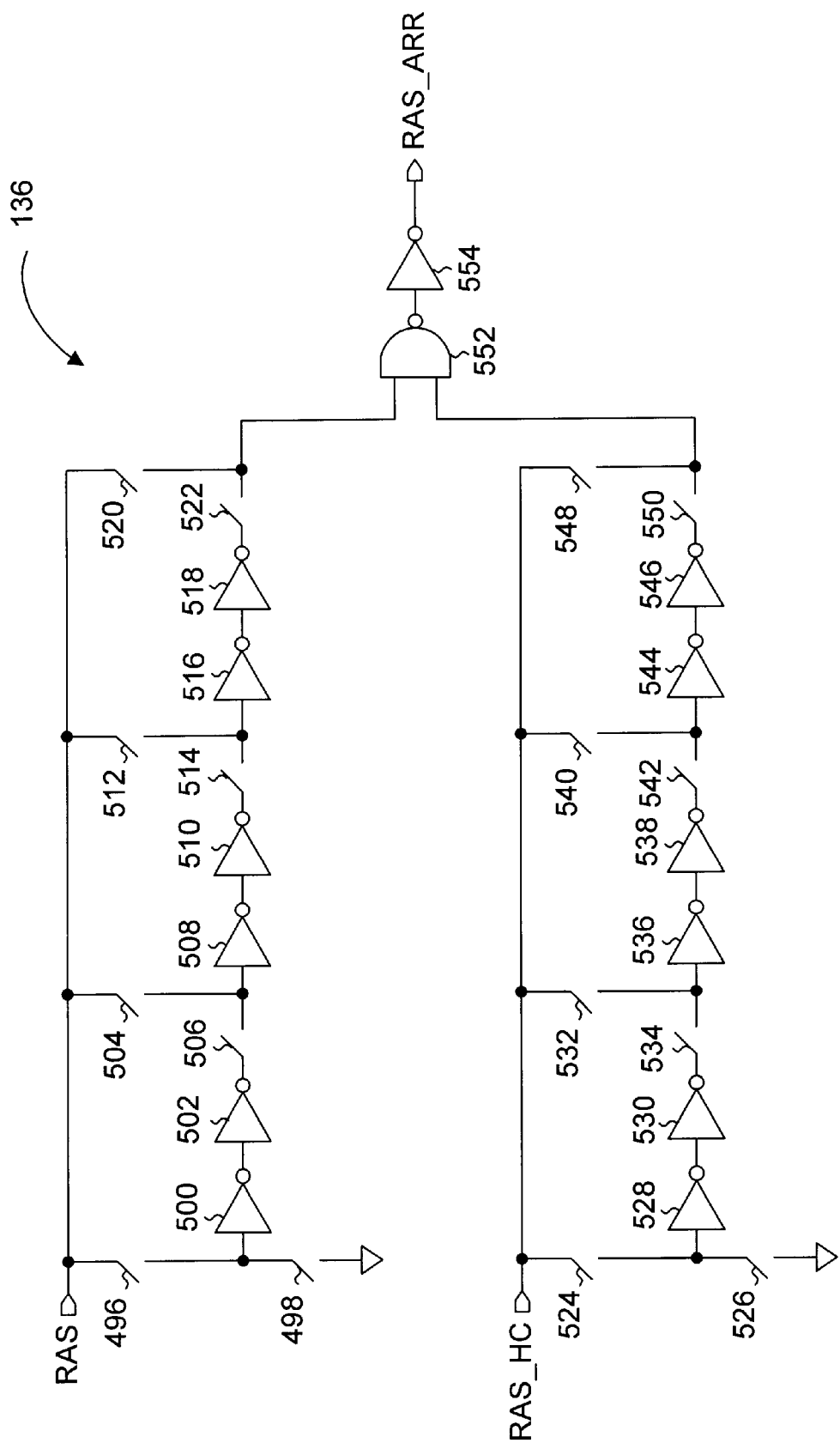
FIG. 19 is a circuit schematic of the RAS delay circuit of FIG. 12.

FIG. 19 shows a circuit schematic of the RAS delay circuit 136 from FIGS. 6 and 12. This circuit includes two delay circuits each coupled to a respective input of NAND gate 552. The output of NAND gate 552 is connected to inverter 554, that drives output terminal RAS_ARR. The first delay circuit includes three pairs of cascaded delay inverters 500/502, 508/510 and 516/518, and four wiring options 496/498, 504/506, 512/514 and 520/522. The second delay circuit is configured identically to the first delay circuit, and includes three pairs of cascaded delay inverters 528/530, 536/538 and 544/546, and three wiring options 524/526, 532/534, 540/542 and 548/550. The common terminals of switch pairs 496/498, 504/506, 512/514, 524/526, 532/534 and 540/542 are connected to the input of inverters 500, 508, 516, 528, 536 and 544 respectively, except switch pairs 520/522 and 548/550 whose common terminals are connected to the inputs of NAND gate 552. Input terminal RAS is connected to the other terminal of switches 496, 504, 512 and 520, and RAS_HC is connected to the other terminal of switches 524, 532, 540 and 548. The other terminal of switches 506, 514, 522, 534, 542 and 550 are connected to the output of inverters 502, 510, 518, 530, 538 and 546 respectively, and the other terminal of switches 498 and 526 are connected to ground. Either one, two or all three pairs of cascaded delay inverters in both the first and second delay circuits can be selectively bypassed with the wiring options. Therefore, signals appearing on input terminals RAS and RAS_HC can each be delayed by up to an additional six inverter transition delays before appearing on the input terminals of NAND gate 552.

Figure 20:
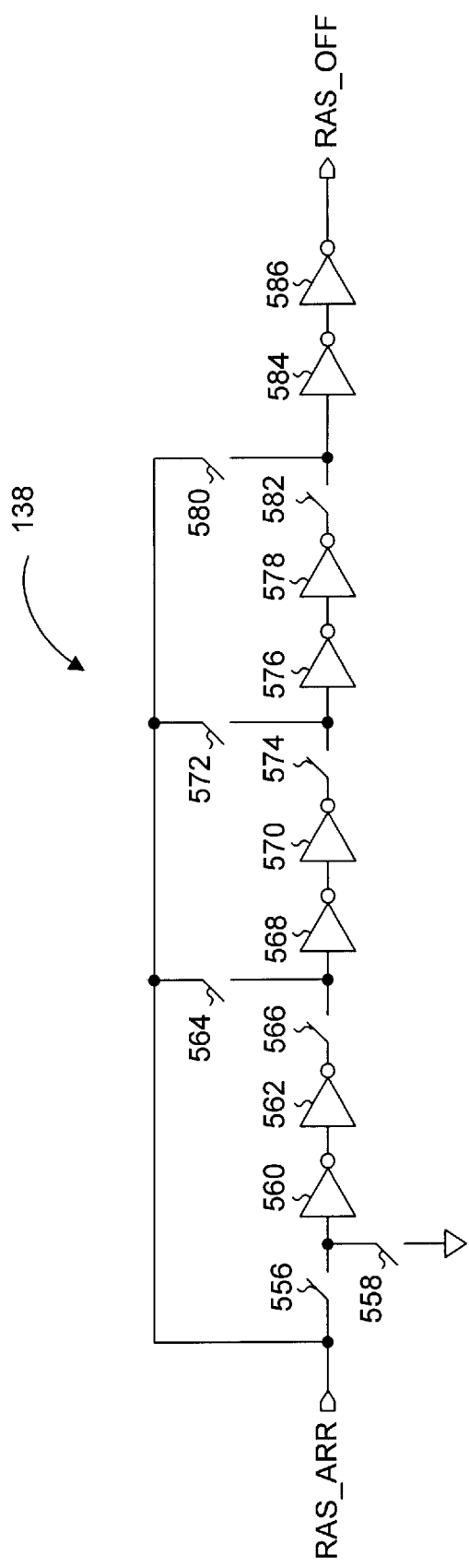
FIG. 20 is a circuit schematic of the falling RAS fall delay circuit of FIG. 12.

FIG. 20 shows a-circuit schematic of the RAS fall delay circuit 138 from FIGS. 6 and 10. RAS fall delay circuit 138 is similar to RAS margin delay circuit 130 in FIG. 18 except that it includes four pairs of cascaded delay inverters 560/562, 568/570, 576/578 and 584/586, and four wiring options 556/558, 564/566, 572/574 and 580/582. The common terminals of switch pairs 556/558, 564/566, 572/574 and 580/582 are connected to the input of inverters 560, 568, 576 and 584 respectively. Input terminal RAS_ARR is connected to the other terminal of switches 556, 564, 572 and 580. The other terminal of switches 566, 574 and 582 are connected to the output of inverters 562, 570 and 578 respectively, and the other terminal of switch 558 is connected to ground. Output terminal RAS_OFF is driven by inverter 586. Therefore, the signal appearing on output terminal RAS_OFF can be delayed by up to an additional six inverter transition delays.

Figure 21:
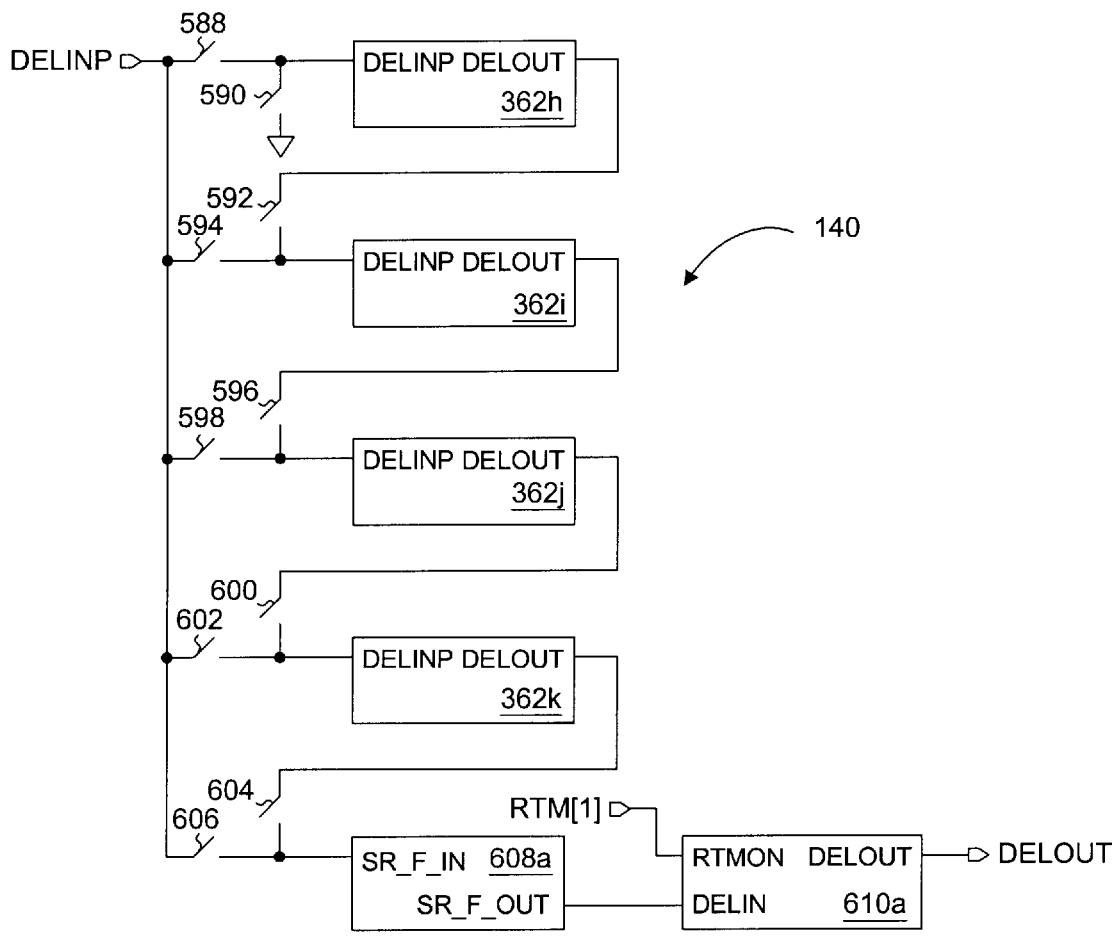
FIG. 21 is a circuit schematic of the SR fall delay circuit of FIG. 12.
Figure 26:
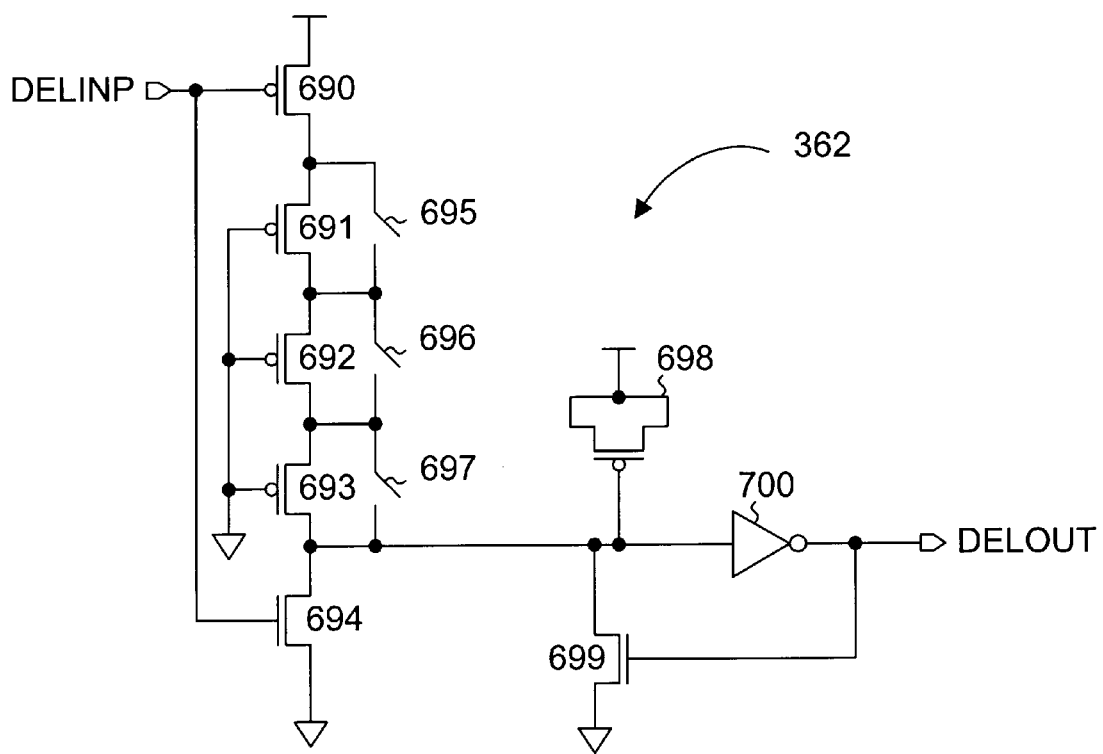
FIG. 26 is a circuit schematic of the transistor-capacitor delay circuit of FIG. 13.
Figure 27:
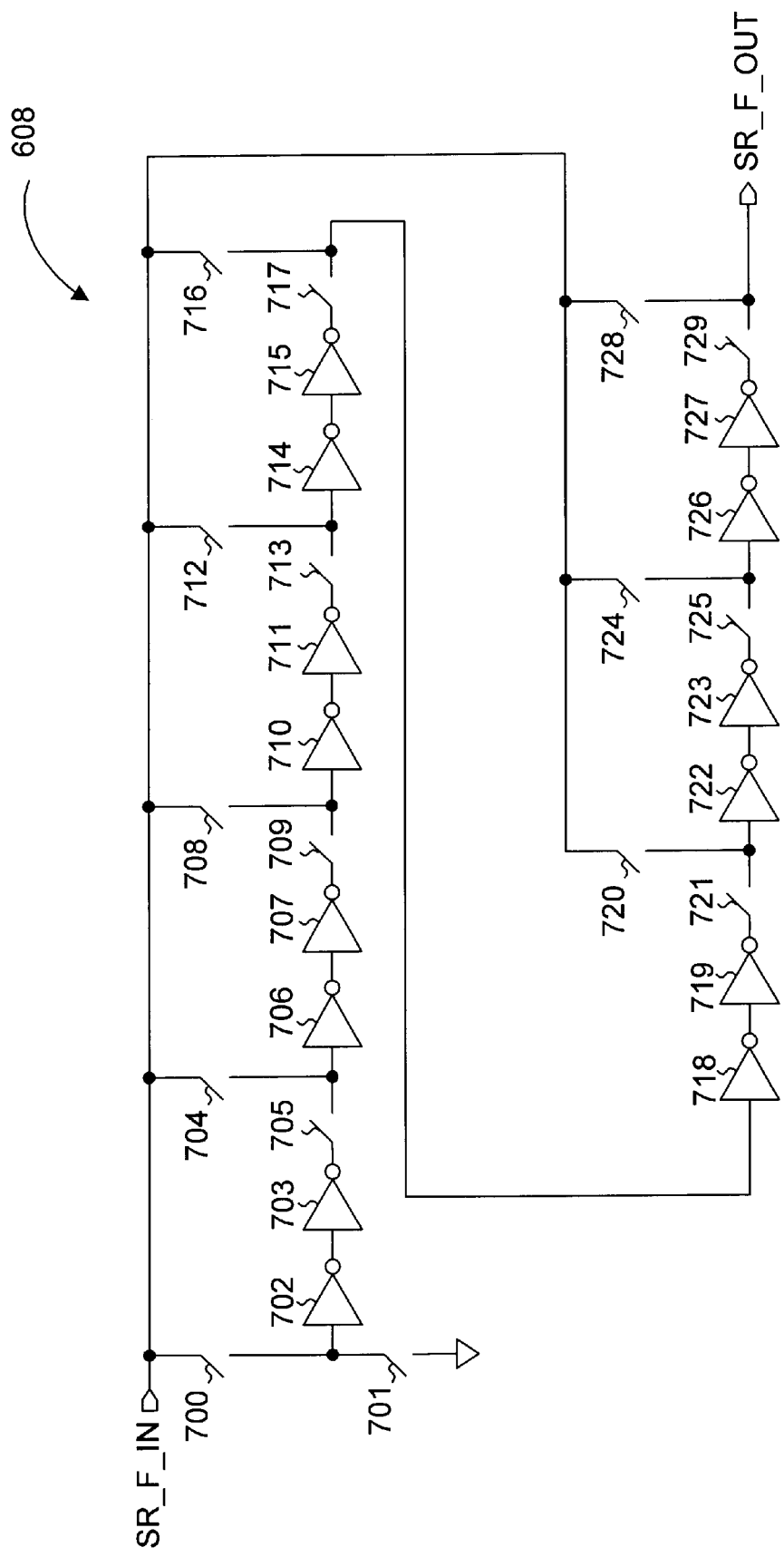
FIG. 27 is a circuit schematic of the SR fall tuning circuit of FIG. 25.
Figure 28:
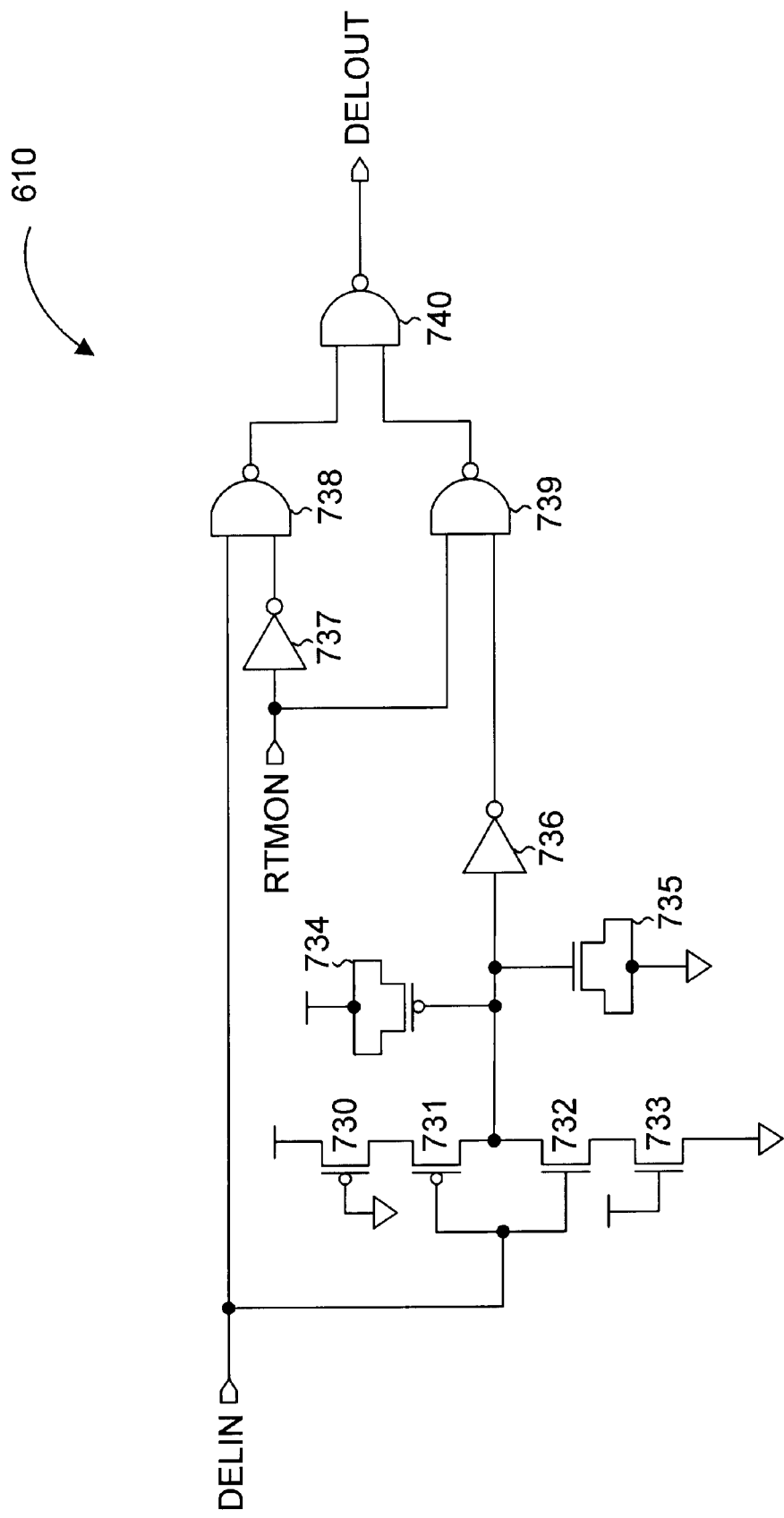
FIG. 28 is a circuit schematic of the RT delay circuit of FIG. 25.

FIG. 21 shows a circuit schematic of the non-inverting SR fall delay circuit 140 from FIGS. 6 and 12. More specifically, SR fall delay circuit 140 can delay propagation of the low logic level signal received at its DELINP input terminal. Although a high logic level signal would also delayed, the delay is significantly shorter than that for a low logic level signal. SR fall delay circuit 140 includes four delay circuits 362*h* through 362*k*, five wiring options 588/590, 592/594, 596/598, 600/602 and 604/606, non-inverting SR tuning circuit 608*a* and non-inverting RT delay circuit 610*a*. The common terminals of switch pairs 588/590, 592/594, 596/598, 600/602 and 604/606 are connected to the DELINP input of delay circuits 362*h* through 362*k* and the SR_F_IN input of SR tuning circuit 608*a* respectively. Input terminal DELINP is connected to the other terminal of switches 588, 594, 598, 602 and 606. The other terminal of switches 592, 596, 600 and 604 are connected to the DELOUT output of delay circuits 362*h* through 362*k* respectively, and the other terminal of switch 590 is connected to ground. The SR_F_OUT output of SR tuning circuit 608*a* is connected to the DELIN input of RT delay circuit 610*a*. RT delay circuit 610*a* also receives signal RTM[1] and drives output terminal DELOUT. Each delay circuit 362 delays propagation of the signal received at its DELINP input by a predetermined amount of time. Therefore a low logic level signal appearing on input terminal DELINP can be delayed from appearing on the input SR_F_IN of SR tuning circuit 608a by up to an amount equal to the aggregate delay of delay circuit blocks 362h through 362k. SR tuning circuit 608a further delays propagation of the signal appearing at its SR_F_IN input, and is itself configurable. RT delay circuit 610a also delays propagation of the signal appearing at its DELIN input to its DELOUT output. However, the delay of this particular circuit is selectable on-the-fly by the system during operation, by setting the state of signal RTM[1]. Therefore, the signal appearing on output terminal DELOUT can be delayed by up to an amount equal to the sum of the delays through delay circuits 362h through 362k, SR tuning circuit 608a and RT delay circuit 610a. The circuit details of blocks 362h through 362k, 608a and 610a are shown in FIGS. 26, 27 and 28 respectively.

Figure 22:
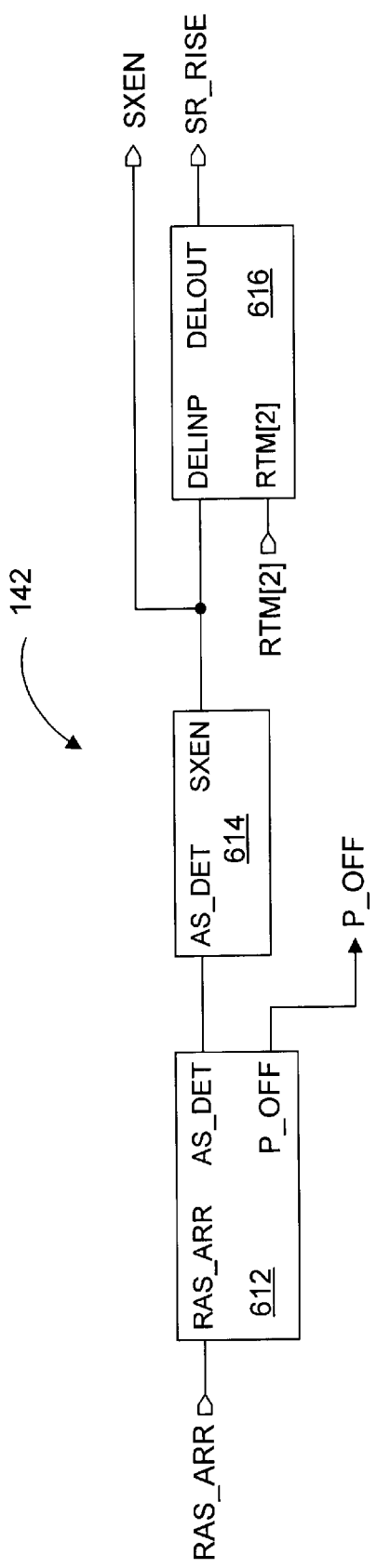
FIG. 22 is a block diagram of the SR rise generator circuit of FIG. 12.

FIG. 22 is a block diagram of the SR rise generator circuit 142 shown in FIGS. 6 and 12. SR rise generator circuit 142 includes non-inverting RAS_ARR delay circuit 612, non-inverting array select delay circuit 614 and non-inverting SR rise delay circuit 616. RAS_ARR delay circuit 612 is connected to input terminal RAS_ARR and has an output AS_DET connected to the AS_DET input of array select delay circuit 614. Output P OFF from RAS_ARR delay circuit 612 is coupled to the bitline precharge devices (not shown). The output SXEN of input of array select delay circuit 614 is connected to the DELINP input of SR rise delay circuit 616. SR rise delay circuit 616 is also connected to input terminal RTM[2], and drives output terminal SR_RISE. Any signal received at the RAS_ARR input terminal is delayed through circuit blocks 612 and 614, and further delayed in circuit block 616 before appearing on the output terminal SR_RISE. Circuit blocks 612, 614 and 616 are shown in further detail in FIGS. 23, 24 and 25 respectively.

Figure 23:
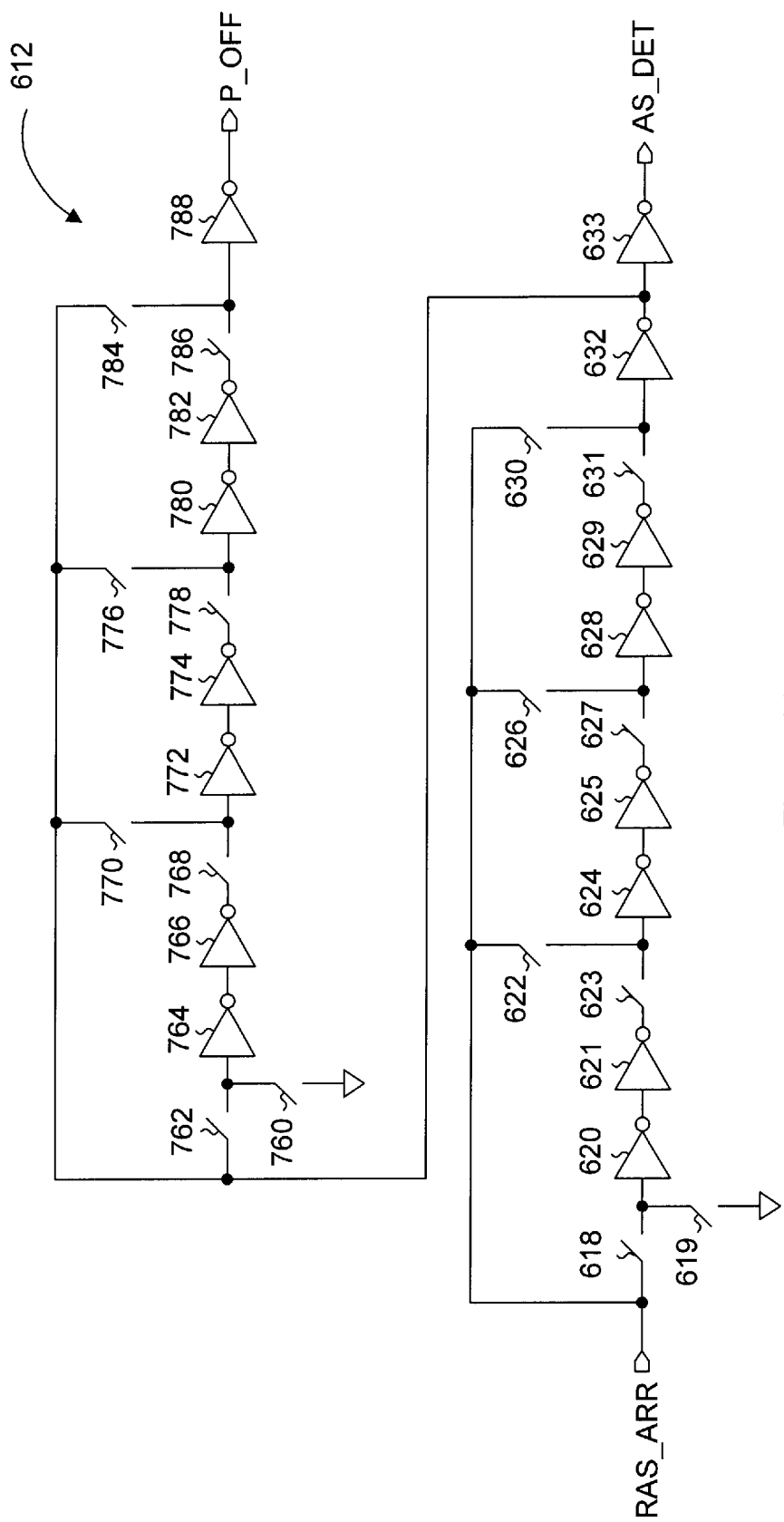
FIG. 23 is a circuit schematic of the RAS_ARR delay circuit of FIG. 22.

FIG. 23 is a circuit diagram of RAS_ARR delay circuit 612 from FIG. 22. RAS_ARR delay circuit 612 includes seven pairs of cascaded delay inverters 620/621, 624/625, 628/629, 632/633, 764/766, 772/774 and 780/782, and eight wiring options 618/619, 622/623, 626/627, 630/631, 760/762, 770/768, 776/778 and 784/786. The common terminals of switch pairs 618/619, 622/623, 626/627, 630/631, 760/762, 770/768, 776/778 and 784/786 are connected to the input of inverters 620, 624, 628, 632, 764, 772, 780 and 788 respectively. Input terminal RAS_ARR is connected to the other terminal of switches 618, 622, 626 and 630. The other terminal of switches 623, 627 and 631 are connected to the output of inverters 621, 625 and 629 respectively, and the other terminal of switch 619 is connected to ground. The output of inverter 632 is connected to the other terminal of switches 762, 770, 776 and 784. The other terminal of switches 768, 778 and 786 are connected to the output of inverters 766, 774 and 782 respectively, and the other terminal of switch 760 is connected to ground. Output terminal AS_DET is driven by inverter 633, and output terminal P_OFF is driven by inverter 788. Therefore, the signal appearing on output terminal AS_DET can be delayed by up to an additional six inverter transition delays, and the signal appearing on output terminal P OFF can be delayed by up to an additional 12 inverter transition delays.

Figure 24:
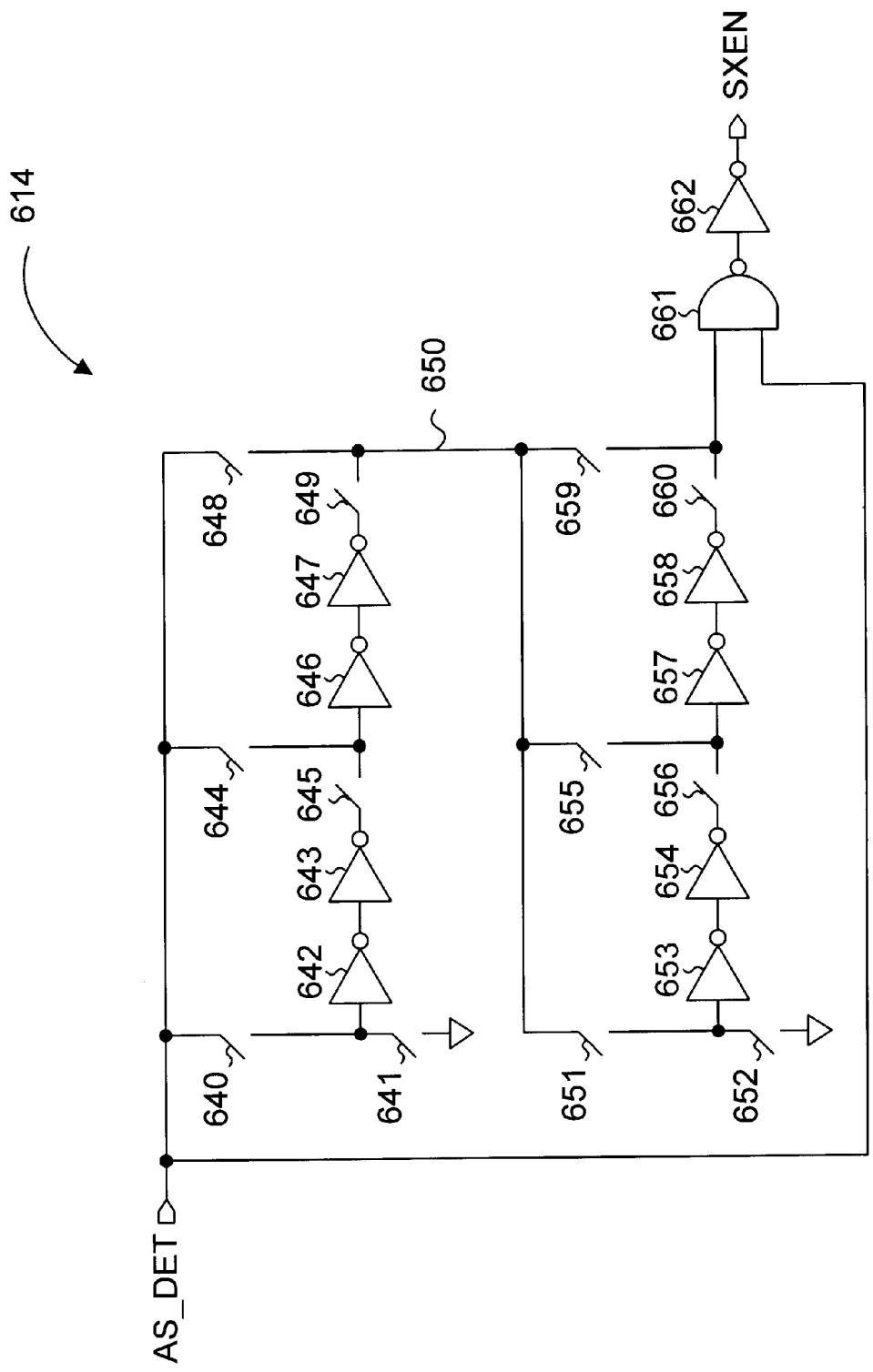
FIG. 24 is a circuit schematic of the array select delay circuit of FIG. 22.

FIG. 24 is a circuit diagram of array select delay circuit 614 shown in FIG. 22. This circuit can be set to delay high logic level signals with a longer period of time than low logic level signals. Array select delay circuit 614 includes four pairs of cascaded delay inverters 642/643, 646/647, 653/654 and 657/658. The circuit also includes six wiring options 640/641, 644/645, 648/649, 651/652, 655/656 and 659/660 that are appropriately placed to enable bypass of between one or all pairs of cascaded delay inverters. The common terminals of switch pairs 640/641, 644/645, 651/652 and 655/656 are connected to the input of inverters 642, 646, 653 and 657 respectively except switch pair 648/649 whose common terminal is connected to node 650 and switch pair 659/660 whose common terminal is connected to an input of NAND gate 661. Input terminal AS_DET is connected to the other terminal of switches 640, 644 and 648, while node 650 is connected to the other terminal of switches 651, 655 and 659. The other terminal of switches 645, 649, 656 and 660 are connected to the output of inverters 643, 647, 654 and 658 respectively, and the other terminal of switches 641 and 652 are connected to ground. The other input of NAND gate 661 is connected to input terminal AS_DET, and its output is connected to the input of inverter 662. The output of inverter 662 drives the output terminal SXEN. Therefore, a high logic level signal appearing on output terminal SXEN can be delayed by up to an additional eight inverter transition delays.

Figure 25:
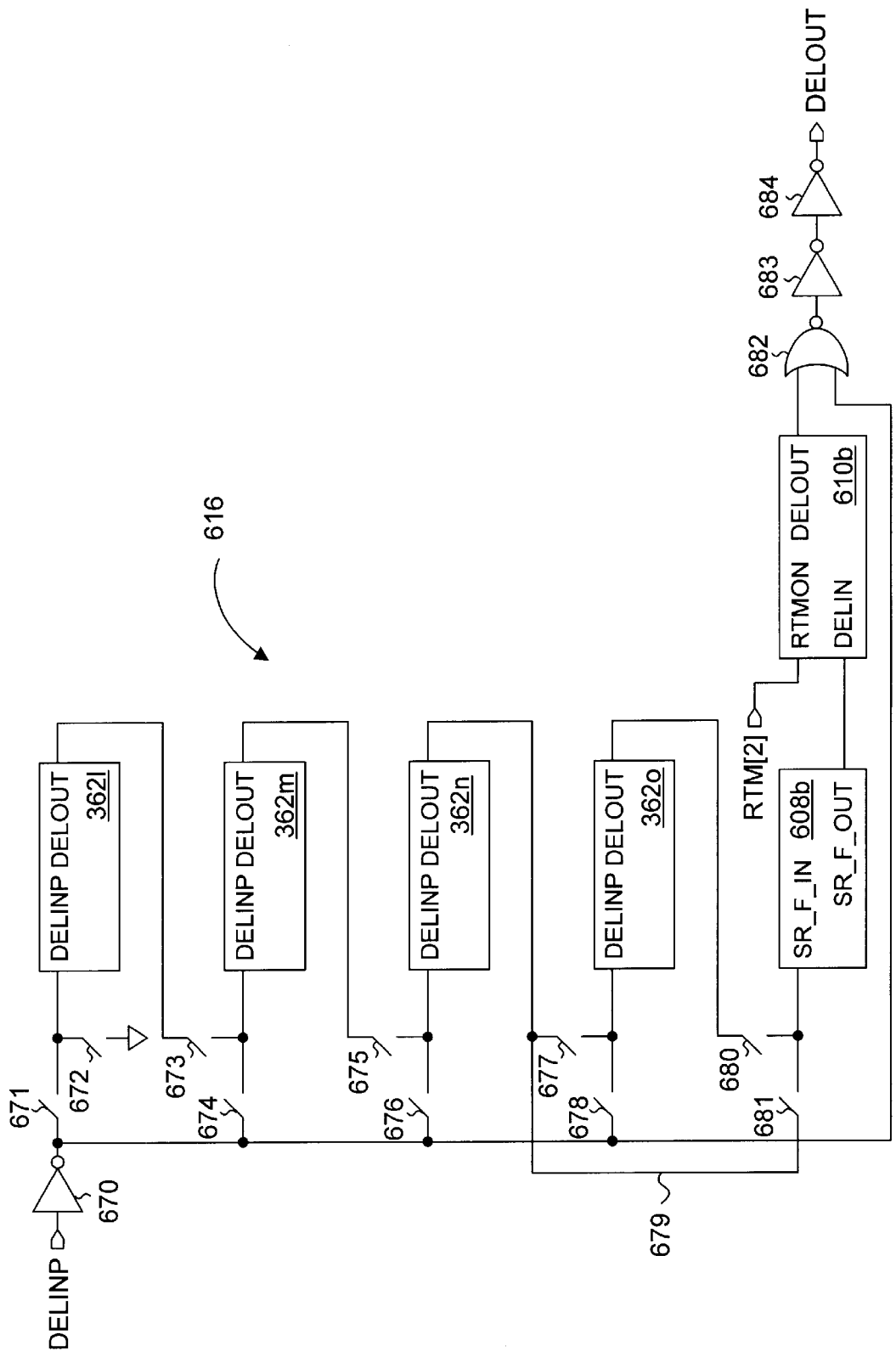
FIG. 25 is a circuit schematic of the SR rise delay circuit of FIG. 22.

FIG. 25 is a circuit diagram of SR rise delay circuit 616 shown in FIG. 22, which is similar in configuration to the SR fall delay circuit 140 FIG. 21. SR rise delay circuit 616 performs the opposite function of SR fall delay circuit 140. More specifically, SR rise delay circuit 616 delays propagation of a high logic level signal received at its DELINP input terminal. Although a low logic level signal would also be delayed, the delay is significantly shorter than that for a high logic level signal. SR rise delay circuit 616 includes four delay circuits 362l, 362m, 362n and 362o, five wiring options 671/672, 673/674, 675/676, 677/678 and 680/681, non-inverting SR tuning circuit 608b and non-inverting RT delay circuit 610b. The common terminals of switch pairs 671/672, 673/674, 675/676, 677/678 and 680/681 are connected to the DELINP input of delay circuits 362l, 362m, 362n and 362o and the SR_F_IN input of SR tuning circuit 610b respectively. Input terminal DELINP is connected the input of inverter 670, whose output is connected to the other terminal of switches 671, 674, 676 and 678. The other terminal of switch 681 is connected to line 679. Line 679 is also connected to the DELOUT output of delay circuit 362n. The other terminal of switches 673, 675, 677 and 680 are connected to the DELOUT output of delay circuits 362l, 362m, 362n and 362o, and the other terminal of switch 672 is connected to ground. The SR_F_OUT output of SR tuning circuit 608b is connected to the DELIN input of RT delay circuit 610b. RT delay circuit 610b also receives signal RTM[2], and its DELOUT output is connected to an input of NOR gate 682. The other input of NOR gate 682 is connected to the output of inverter 670. The output of NOR gate 682 is connected to a pair of serially connected inverters 683 and 684, and the output of inverter 684 drives the output terminal DELOUT. It should be noted that signal RTM[2] performs a similar function to signal RTM[1] from FIG. 21. Therefore, the high logic level signal appearing on output terminal DELOUT can be delayed by up to an amount equal to the sum of the delays through delay circuits 362l, 362m, 362n and 362o, SR tuning circuit 608b and RT delay circuit 610b.

FIG. 26 is a circuit schematic of the delay circuits 362a through 362o shown in FIGS. 13, 14, 15, 21 and 25. Delay circuits 362a through 362o are programmable delay circuits that share the same pre-programmed circuit configuration, but each instance of delay circuit 362 can be configured differently from each other. The circuit schematic shown in FIG. 26 is the pre-programmed circuit configuration of delay circuits 362a through 362o. As previously mentioned, this circuit is specifically configured to delay the propagation of a low logic level signal appearing on its DELINP input terminal. High logic signals are delayed by an amount equal to two inverter delays. Delay circuit 362 includes four p-channel transistors 690, 691, 692 and 693, and an n-channel transistor 694 connected in series between VDD and VSS. Transistors 690 and 694 form a complementary pair having both their gates connected to input terminal DELINP, and p-channel transistors 691, 692 and 693 have their gates connected to ground. There are three wiring options shown as switches 695, 696 and 697 connected between the source and drain of transistors 691, 692 and 693. The shared source/drain terminal of transistors 693 and 694 is connected to the input of inverter 700, whose output drives output terminal DELOUT. A p-channel MOS capacitor 698 has its source and drain terminals connected to VDD and its gate connected to the input of inverter 700. A weak n-channel transistor 699 couples the shared source/drain terminal of transistors 693 and 694 to VSS, and has a gate connected to the output terminal DELOUT, the arrangement otherwise known as a half-latch configuration. The maximum signal delay is obtained by keeping switches 695, 696 and 697 in the open state such that VDD is coupled to the output node through p-channel transistors 691, 692 and 693. Additionally, further delay is added due to the half-latch circuit which is holding the input of inverter 700 at the low logic level. The W/L size of n-channel transistor 699 is set as a long channel device, such as 0.3/3.0 for example, so that it can be eventually overcome by the p-channel transistors. Each of transistors 691, 692 and 693 can have identical or different W/L sizes such that any combination of switches 695, 696 and 697 can be closed to obtain the desired delay value. For example, transistor 691 can be set at 1.1/0.2, transistor 692 can be set at 1.1/0.5 and transistor 693 can be set at 1.1/1.2. In an alternative embodiment, the gates of transistors 691, 692 and 693 can be connected to an analog biasing voltage for controlling the resistances, and thus the signal propagation delay through the transistors.

FIG. 27 is a circuit schematic of the SR tuning circuits 608a and 608b from FIGS. 21 and 25. SR tuning circuits 608a and 608b are programmable delay circuits that share the same pre-programmed circuit configuration, but each instance of SR tuning circuit 608 can be configured differently from each other. The circuit schematic shown in FIG. 27 is the pre-programmed circuit configuration of SR tuning circuits 608a and 608b. This circuit includes seven pairs of cascaded delay inverters 702/703, 706/707, 710/711, 714/715, 718/719, 722/723 and 726/727. The circuit also includes eight wiring options 700/701, 704/705, 708/709, 712/713, 716/717, 720/721, 724/725 and 728/729 that are appropriately placed to enable bypass between one or all pairs of cascaded delay inverters. The common terminals of switch pairs 700/701, 704/705, 708/709, 712/713, 716/717, 720/721 and 724/725 are connected to the input of inverters 702, 706, 710, 714, 718, 722 and 726 respectively, and the common terminal of switch pair 728/729 is connected to the output terminal SR_F_OUT. Input terminal SR_F_IN is connected to the other terminal of switches 700, 704, 708, 712, 716, 720, 724 and 728. The other terminal of switches 705, 709, 713, 717, 721, 725 and 729 are connected to the output of inverters 703, 707, 711, 715, 719, 723 and 727 respectively, and the other terminal of switch 701 is connected to ground. Therefore, the signal appearing on output terminal SR_F_OUT can be delayed by up to an additional fourteen inverter transition delays.

FIG. 28 is a circuit schematic of the RT delay circuit 610a and 610b of FIGS. 21 and 25. RT delay circuit 610a and 610b are programmable delay circuits that share the same pre-programmed circuit configuration, but each instance of RT delay circuit 610 can be configured differently from each other. The circuit schematic shown in FIG. 28 is the pre-programmed circuit configuration of delay RT delay circuit 610a and 610b. This circuit includes a modified inverter having p-channel transistors 730 and 731, and n-channel transistors 732 and 733 serially connected between VDD and ground. The gates of transistors 730 and 733 are wired to ground and VDD respectively to keep them turned on. The gates of transistors 731 and 732 are connected in common to the input terminal DELIN. The shared source/drain terminal of transistors 731 and 732 is connected to the gates of p-channel MOS capacitor 734, n-channel MOS capacitor 735 and the input of inverter 736. NAND gate 738 has an input connected to input terminal DELIN and another input coupled to input terminal RTMON via inverter 737. Input terminal RTMON is also connected to an input of NAND gate 739, while the other input of NAND gate 739 is connected to the output of inverter 736. The outputs of NAND gates 738 and 739 are connected to the inputs of NAND gate 740, whose output drives the output terminal DELOUT. RT delay circuit 610 has two paths through which the signal appearing on the input terminal DELIN can propagate. The path where DELIN is connected to NAND gate 738 is the non-delayed route whereas the path where DELIN is coupled to NAND gate 739 is the delayed route. The logic level of the signal on input terminal RTMON determines which path is taken. A high logic level signal appearing on RTMON disables the non-delayed route, and conversely, a low logic level signal appearing on RTMON disables the delayed route.

Figure 29:
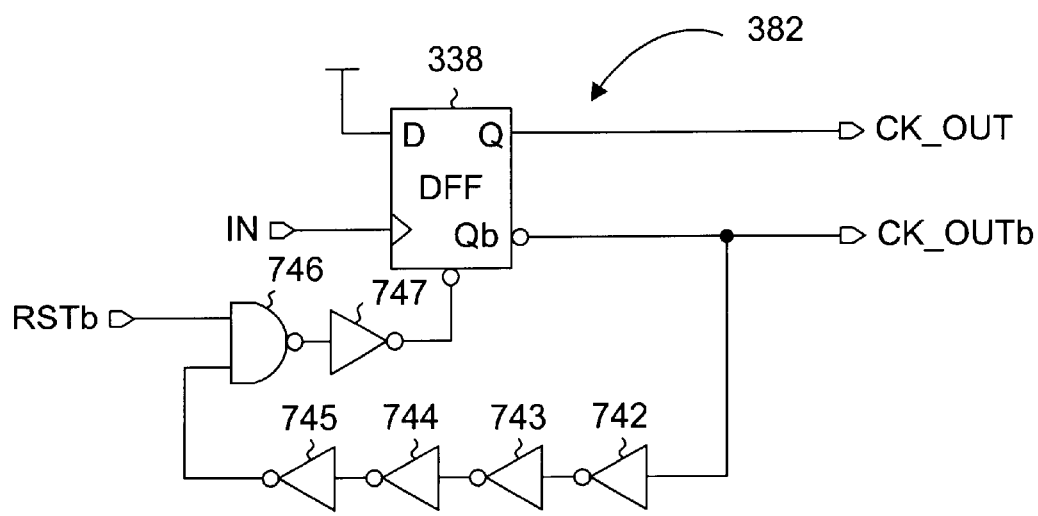
FIG. 29 is a circuit schematic of the clock pulse generator of FIG. 14.

FIG. 29 is a circuit schematic of clock generator circuit 382 of FIGS. 14 and 15. Clock generator circuit 382 includes a flip-flop 338 having VDD connected to its D input, input terminal IN connected to its clock input, and the output of inverter 747 connected to its reset input. The Q output of flip-flop 338 drives the CK_OUT output terminal and the Qb output of flip-flop 338 drives the CK_OUTb output terminal. CK_OUTb is coupled to an input of NAND gate 746 via four serially connected inverters 742, 743, 744 and 745, and the other input of NAND gate 746 is connected to the RSTb input terminal. The output of NAND gate 746 is connected to the input of inverter 747. Clock generator circuit 382 is configured to self reset after output Q is driven to the high logic level on the rising edge at input terminal IN. Therefore clock generator circuit 382 generates high and low logic level CK_OUT and CK_OUTb pulses respectively. The duration of the pulses is determined by the propagation delay of the low logic level CK_OUTb signal through inverters 742, 743, 744, 745, NAND gate 746 and inverter 747.

Figure 30:
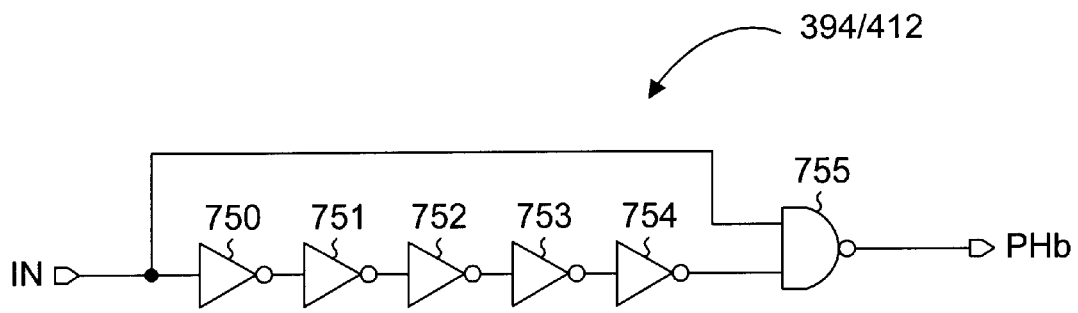
FIG. 30 is a circuit schematic of the rising edge detector of FIG. 15.

FIG. 30 is a circuit schematic of pulse delay circuit 394 and 412 of FIG. 15. Pulse delay circuit 394 includes five serially connected inverters 750, 751, 752, 753 and 754 coupled between an input of NAND gate 755 and input terminal IN. The other input of NAND gate 755 is connected to input terminal IN, and its output drives output terminal PHb. Pulse delay circuit 394 detects a rising edge on input terminal IN to generate a low logic level pulse on output terminal PHb.

The circuits of FIGS. 18–21, 23 and 27 are programmable, typically during the design stage in a preferred embodiment, and are shown in their pre-programmed state. Once designers have the pre-programmed configuration of the row timing circuit, row timing emulator and margin delay circuits, the interface circuit for operating a desired embedded DRAM to its maximum speed can be customized. For example, once the parameters for a desired embedded DRAM are set, simulations can be run to determine the earliest, or optimum time to activate the bitline sense amplifiers after row addresses are latched, for both read and write operations. Simulations are then run to determine the earliest, or optimum time to activate the column decoders after the bitline sense amplifiers are activated. The delay elements comprising complementary switches and inverters are programmed in the row timing circuit such that the row timing circuit activates the bitline sense amplifiers at the optimum bitline sense amplifier activation time. Then the delay elements of the row timing emulator can be programmed in a manner identical to the programmed row timing circuit. Now the programmed row timing emulator can generate an emulated row timing signal at the optimum bitline sense amplifier activation time. Finally, delay elements of the margin delay circuit are programmed to activate the column decoders at the optimum column decoder activation time after receiving the emulated row timing signal for read and write operations.

A detailed description of a normal read access operation follows with reference to the timing diagram of FIG. 4 and the circuit schematics of FIGS. 5, 6, 7, 8, 9, 10, 11, 12, 13, 14 and 16. It is first assumed that all circuits are in the inactive state, and all output signals from command decoder 202 in FIGS. 9 and 10 are at their inactive levels. For example, signals ACTCK, ACT, RST, SR and ACTIVE are at the low logic level, and signal FACTCKb is at the high logic level. In non-turbo page mode, signal PMODE remains at the low logic level to disable page mode control circuit 292 of FIG. 15 such that ACTEN and PCLKb remain at the high logic level. Upon receipt of a valid command by command decoder 202 on the rising edge of CK, FACTCKb pulses to the low logic level. Shortly after FACTCKb falls to the low logic level, ACTIVE is driven to the high logic level in FIG. 9, causing ACTCK to pulse to the high logic level. The high logic level ACTCK pulse causes ACT to be driven to the high logic level. It should be noted that a valid row address has been provided to address buffer 204 at the same time the valid commands are issued to command decoder 202. Thus activate and precharge circuits 440 of FIG. 16 receive the predecoded bank address signals BADECb [i] and the high logic level ACT signal to generate an active ACT[i] signal. The high logic level ACT[i] signal is received by internal row clock generator 122 of row timing circuit 120 of the selected memory bank. Now the high logic level of the selected ACT[i] signal is driven onto the D input of flip-flop 132 of FIG. 7, but is not latched until RCLK rises to the high logic level. When FACTCKb pulses to the low logic level in FIG. 11, RCLK is pulsed to the high logic level since the high logic level PCLKb output of page mode control circuit 400 allows NAND gate 304 to pass FACTCKb. RCLK at the high logic level initiates latching of the active ACT[i] signal by flip-flop 132 in FIG. 7 for driving IRCLK to the high logic level. The high logic level ACTCK pulse is also received by row timing emulator 288 of FIG. 12 at about the same time that the high logic level RCLK is received by row timing circuit 120. Therefore, respective local clock signals IRCLK from row timing circuit 120 and row timing emulator 288 are driven to the high logic levels at about the same time. Eventually, the row decoders and wordline drivers 116 of the selected block are enabled via signal SXEN from the selected row timing circuit 120 of FIG. 6 for driving a selected wordline after the precharge devices have been turned off via signal P_OFF. Bitline potential levels will change according to the data stored in the memory cells coupled to the driven wordline. Signal SAON is driven and latched to the high logic level after SXEN is driven to the high logic level after a delay provided by SR rise generator 142 in FIG. 6. This delay gives the bitlines time to develop a voltage level after wordline activation before the bitline sense amplifiers 112 are turned on by signal SAON. Signal SR from row timing emulator 288 is driven to the high logic level at about the same time as SAON is driven to the high logic level from row timing circuit 120. In FIG. 11, the high logic level of SR is received by column clock delay circuit 290 for generation of CCLK and PCHCK. As shown in further detail in FIGS. 13 and 14, the rising edge of SR will cause flip-flop 338 to drive its Q output to the high logic level. In a read operation, signal SR propagates through delay circuit 362a and a high logic level CCLK pulse is generated from the CCLK clock generator circuit 382. SR also propagates through delay circuits 362c and 362d for initiating generation of a PCHCK pulse by the PCHCK clock generator circuit 382. Alternatively, less delay is required for a write operation than in the read operation, so signal SR propagates through delay circuits 362b, 362c and 362e and high logic level CCLK and PCHCK pulses are generated earlier than in the read operation. The CCLK pulse initiates latching of the column addresses to be decoded by the column decoders (not shown). Data from the bitline sense amplifiers are transferred to the system databus shortly thereafter. The high logic level SR signal is feedback to its internal row clock generator 314, which drives its internal IRCLK signal to the low logic level. The internal IRCLK signal propagates through row timing emulator 288 of FIG. 12 to drive SR to the low logic level. The falling edge of SR is detected by falling edge negative pulse generator circuit 262 of FIG. 9, and signal PCH is pulsed to the high logic level by inverter 268 and ACT is driven to the low logic level by inverter 254. The high logic level of PCH is received by all activate and precharge circuits 440 of FIG. 16, and a high logic level PRE [i] signal is generated for each memory bank row timing circuit 120. In FIG. 7, the low logic level feedback of Qb forces NAND gate 126 to drive an input of NAND gate 130 to the high logic level, and the high logic level PRE[i] signal causes NAND gate 128 to drive the other input of NAND gate 130 to the high logic level. Therefore, NAND gate 130 drives the D input of flip-flop 132 to the low logic level. However, this low logic level is not latched until a rising edge of RCLK is received. In FIG. 11, the high logic level PCHCK pulse causes NAND gate 298 to output a low logic level pulse. Therefore, RCLK is pulsed high again to permit flip-flop 132 of FIG. 7 to latch the low logic level on its D input. Hence internal clock signal IRCLK falls to the low logic level and SAON eventually drops to the low logic level, turning off the bitline sense amplifiers and turning on the bitline precharge devices. The falling edge of the PCHCK pulse is detected by falling edge negative pulse generator circuit 270 of FIG. 9 for resetting the PCH latch and driving PCH to the low logic level. Because the entire read operation is completed within one system clock cycle, new data can be provided by the SDRAM in successive system clock cycles.

In a preferred embodiment of the present invention, the general design of the row timing circuit and SRAM interface is preset. Designers using a DRAM compiler, such as the ATMOS DRAM compiler, need only specify the size of the desired embedded DRAM memory array(s) and the desired taccess time. The compiler then determines the necessary delays required for the row timing circuit and selects the appropriate wiring options to provide a customized row timing circuit. Since the specific parameters and delays for the desired embedded memory are now known to the compiler, the row timing emulator circuit can be quickly generated for the SRAM interface. Although signal SR is preferably activated at the same time SAON is activated for any selected bank, SR can be activated shortly after SAON is activated.

Figure 31:
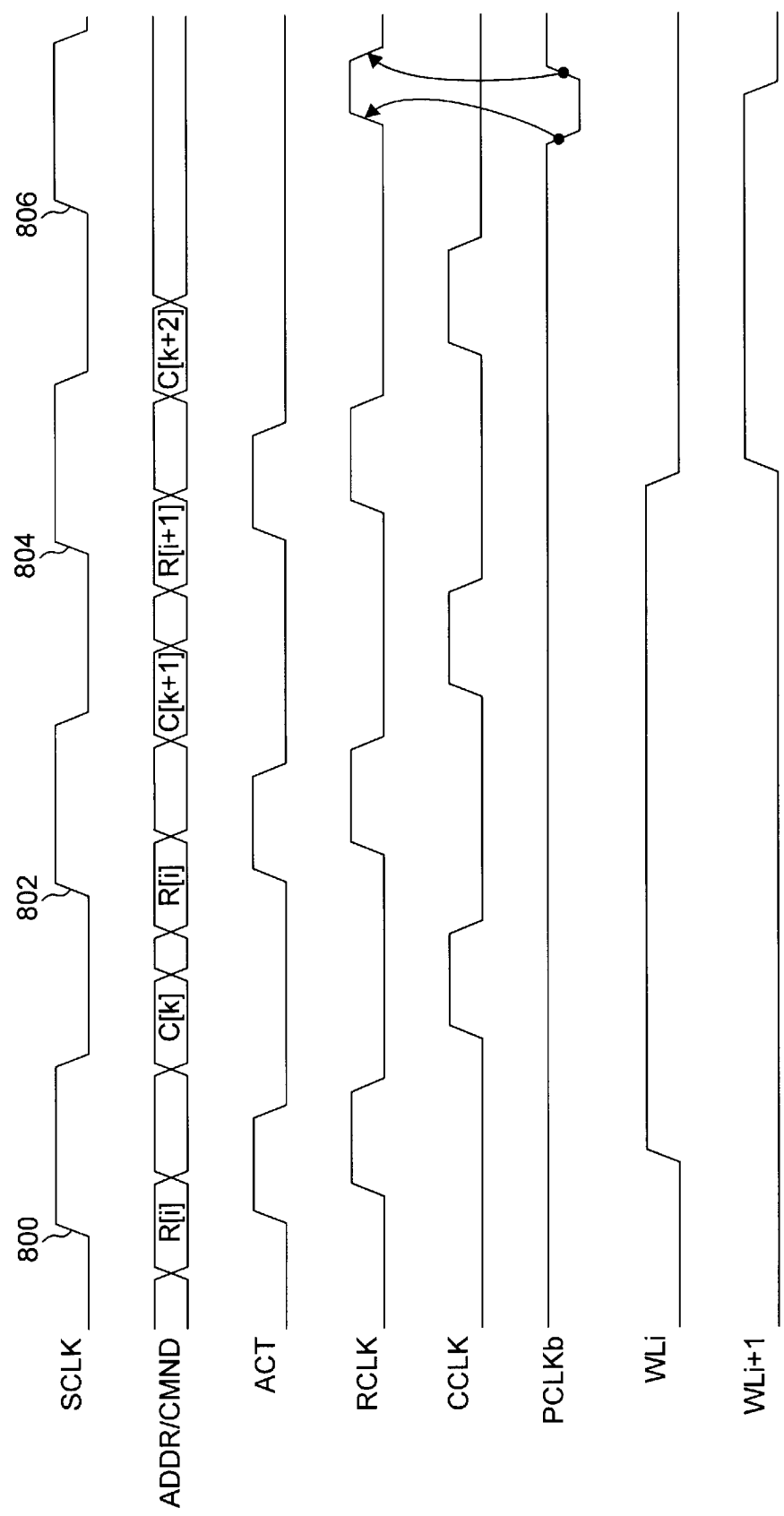
FIG. 31 is a timing diagram illustrating turbo page mode access operations for the DRAM memory of FIG. 3 according to another embodiment of the present invention.

FIG. 31 is a timing diagram illustrating a turbo page mode read access operation of the SRAM emulator according to an embodiment of the present invention. In this particular example, it is assumed that there are n memory banks in the system and only one bank i is activated during any read access operation. The timing diagram shows the signal traces for the external clock signal CLK, the address and command signals ADDR/CMND, activate signal ACT, row clock RCLK, column clock CCLK, precharge clock PCLKb, a wordline WL[i] from bank i and a different wordline WL[i+1] from bank i+1. This figure is described with reference to the circuit schematics of FIGS. 5, 6, 7, 8, 11, 12, 15, and 16. It is first assumed that all circuits are in the inactive state, and all output signals from command decoder 202 in FIG. 9 are at their inactive levels. For example, signals ACTCK, ACT, RST, SR and ACTIVE are at the low logic level, and signal FACTCKb is at the high logic level. In turbo page mode, signal PMODE remains at the high logic level to enable page mode control circuit 292 of FIG. 15 such that ACTEN and PCLKb are controlled by CK and ACTIVE. With signal PMODE at the high logic level, NAND gate 298 of FIG. 11 locks out the PCHCK output of margin delay circuit 290, preventing generation of an RCLK pulse by the PCHCK pulse. In activate and precharge circuit 440 of FIG. 16, PMODE at the high logic level sets all the PRE[i] signals to the high logic level. At the first rising edge 800 of system clock SCLK a valid read command and row address R[i] is provided, and command decoder output signals ACTIVE, ACTCK and FACTCKb are activated as previously described in the normal mode of operation. When signal ACTIVE is generated by command decoder 202, the high logic level ACTIVE signal propagates quickly through page mode control circuit 292 of FIG. 15 to keep the RSTb input of clock circuit 382 in the reset state and to drive signal ACTEN to the high logic level. Cross-coupled NOR gates 406 and 408 also latch the high logic level of ACTIVE. ACTEN is fedback to command decoder 202 of FIG. 9 to enable activation of signal ACT via the active ACTCK pulse. Now the RCLK and CCLK pulses are generated in the same manner as described above for the normal mode of operation, and wordline WLi addressed by R[i] is driven to the high logic level shortly after the rising edge of the RCLK pulse as shown in FIG. 31. A column address C [k] is provided for accessing bitlines of the selected bank on the rising edge of the CCLK pulse. PCH is driven to the high logic level and ACT is driven to the low logic level in FIG. 9 when SR falls to the low logic level, but the high logic level of PCH has no effect on the activate and precharge circuit 440 of FIG. 16. Since signal PRE[i] is at the high logic level, NAND gate 130 of internal row clock generator 122 of FIG. 7 automatically drives the D input of flip-flop 132 to the low logic level due to the feedback of the Q output to NAND gate 128 when ACT[i] falls to the low logic level. Furthermore, the PCHCK pulse generated by margin delay circuit 290 is prevented from generating an RCLK pulse by NAND gate 298. Therefore internal row clock generator 122 of FIG. 7 continues to drive IRCLK at the high logic level and WLi remains driven for the duration of system clock cycle 800.

At the second rising edge 802 of SCLK another read command and address is provided. In this read cycle, the row address R[i] is the same row address as the previous read cycle, but the column address C[k+1] is different from the previous column address. Because a read command has been issued, a high logic level ACTIVE signal is generated to keep PCLKb of page mode control circuit 292 of FIG. 15 at the high logic level. The latched state of cross-coupled NOR gates 406 and 408 does not change from the previous read cycle. Since the same row address has been provided, the previously driven ACT[i] is again driven to the high logic level. Therefore NAND gate 130 of FIG. 7 drives the D input of flip-flop 132 to the high logic level, and flip-flop 132 continues to drive IRCLK of the previously selected internal row clock generator 122 to the high logic level to keep the selected wordline WLi activated on rising edge of RCLK. All non-selected banks will have their IRCLK signals driven to the low logic level on the rising edge of RCLK, thus keeping their bitlines precharged. A CCLK pulse is then generated in the same manner as previously discussed for the first read cycle.

At the third rising edge 804 of SCLK, another read command and address is provided. However, both the row address R[i+1] and column address C[k+2] are different from the previous access cycle. Now signal ACT[i+1] (not shown) is driven to the high logic level and ACT[i] is driven to the low logic level. On the rising edge of RCLK, internal row clock generator 122 receiving ACT[i+1] drives its IRCLK to the high logic level while the internal row clock generator 122 receiving ACT[i] drives its IRCLK to the low logic level. In otherwords, the non-selected banks, including bank i, is precharged. Wordline WLi+1 is then driven to the high logic level and a CCLK pulse is generated to access the bitlines. Page mode control circuit 292 responds as described in the previous two read cycles to the high logic level ACTIVE signal.

At the fourth rising edge 806 of SCLK, no command or an invalid command is issued to the command decoder 202. This cycle is thus called a no operation cycle because the SRAM interface is not instructed to perform any function with the embedded SDRAM. Consequently, ACTIVE is driven to the low logic level, and no ACT pulse is generated. Activate and precharge circuit 440 of FIG. 16 drives all ACT[i] signals to the low logic level when ACT is at the low logic level. Therefore, the command decoder 202 does not issue the high logic level ACTCK pulse or a low logic level FACTCKb signal for generating the RCLK pulse in FIG. 11. In page mode control circuit 292 of FIG. 15, the low logic level ACTIVE signal is clocked through NAND gate 398 and inverted by inverter 416. NAND gate 418 now drives the input of NOR gate 422 to the low logic level, and NOR gate 422 drives the input of NOR gate 428 to the high logic level. The output of NOR gate 430 is latched to the high logic level, and clock circuit 382 is released from the reset state. Thus, clock circuit 382 generates a low logic level PCLKb pulse on the rising edge of CK. In clock sequencer circuit 206 of FIG. 11, the low logic level PCLKb pulse is received by NAND gate 304 for generating a high logic level RCLK pulse. With all address signals at the low logic level, including ACT[i] and ACT[i+1], all internal row clock generator circuits 122 are reset to drive their internal IRCLK signals to the low logic level on the rising edge of RCLK. All the wordlines are lowered, including wordline WLi+1 in FIG. 31. The embedded memory is now prepared for an access in a subsequent access cycle.

In summary, the turbo page mode embodiment of the present invention permits the memory to precharge memory banks at the beginning of a subsequent memory access cycle instead of during a current access cycle as illustrated in the previous example. When compared to the non-page mode operation the present invention shown in FIG. 4, the access time per cycle in turbo page mode operation is shorter by an amount approximately equal to the precharge phase. This allows system designers to increase the system clock speed and maximize system performance.

The advantages of the SRAM interface of the present embodiment are now discussed. The SRAM interface of the present embodiment can operate embedded DRAM at its fastest possible speed because it generates internally clocked signals based on delays associated with specific memory configurations. The SRAM interface preferably includes a row timing emulator circuit having substantially identical components, configuration and layout as normal row timing emulator circuits. This ensures that the delays of both the row timing emulator and normal row timing circuit will track each other with voltage and temperature variations of the system. Therefore an SOC device will be able to randomly access the embedded memory faster than with prior art SRAM interfaces, resulting in improved SOC speed performance.

The turbo page mode operation takes advantage of the emulated row timing feature of the present invention, such that data is provided within each system clock cycle even when different memory banks are accessed. There is minimal circuit overhead to implement the turbo page mode operation. For example, because the row addresses are strobed at each system clock cycle there is no need for registers and logic for comparing the current row address with the previous row address. Therefore, semiconductor real estate is conserved and design complexity is minimized. The SRAM interface embodiment of the present invention could increase the performance of SOC devices for use in networking products or video applications for example.

The present embodiment of the SRAM interface includes a row timing emulator circuit to emulate the timing of a row timing circuit. However, in an alternate embodiment, SAON output signals from the individual row timing circuits can be OR'd together to produce a single row timing signal for triggering generation of the column clock signals within the SRAM interface.

The SRAM interface embodiment of the present invention is not limited to providing optimum timing for read and write operations. As with standard SDRAM, more complex operations such as single cycle concurrent read-and-write and refresh for example, can be provided by the SRAM interface. In the concurrent read-and-write operation, data from a specific memory location is read and then overwritten by new data. The timing of this operation is highly optimised and follows the DRAM timing through the use of the row timing emulation circuitry. The refresh operation is also optimised, and allows for refresh of more than one row address in a single refresh cycle. Additional operations can include hidden write, auto-refresh and self-refresh.

According to another embodiment of the present invention, the SRAM interface can include control registers to allow flexible control of the delay within margin delay circuit 290 during the operation of the device. This feature can be used during manufacturing test, user's test, or during normal operation to adjust the SDRAM memory characteristics. Additionally, this feature allows for at-speed-testing capabilities, if the speed of the embedded DRAM operation exceeds the speed of the testing equipment. Furthermore, the timing control registers may be also accessible to a BIST (Built-In Self Test) circuit, allowing for timing characterisation and auto-timing relaxation for failure-free operation. Additional test circuits can be provided to characterise internal delays of the SRAM interface during manufacturing and testing.

The above-described embodiments of the invention are intended to be examples of the present invention. Alterations, modifications and variations may be effected the particular embodiments by those of skill in the art, without departing from the scope of the invention which is defined solely by the claims appended hereto.

What is claimed is:

1. An interface circuit for controlling embedded DRAM memory having a row timing circuit for activating row decoders and bitline sense amplifiers, and column decoders for accessing bitlines, comprising:

a command decoder for receiving command signals and providing control signals in response to a system clock; and, a clock sequencer for activating the row timing circuit in response to the control signals, and for activating the column decoders at a predetermined delay after activation of the row timing circuit, the column decoders being activated after the bitline sense amplifiers are activated and within the same system clock cycle that the row timing circuit is activated.

2. The interface circuit of claim 1, wherein the command signals include SRAM control signals.

3. The interface circuit of claim 1, wherein the clock sequencer generates a precharge clock signal for precharging the bitlines after the column decoders are activated.

4. The interface circuit of claim 1, wherein the row timing circuit generates a sense amplifier activation signal for turning on the bitline sense amplifiers.

5. The interface circuit of claim 4, wherein the clock sequencer includes a row timing emulator for generating an emulated row timing signal at the same time the sense amplifier activation signal is generated, and a margin delay circuit for receiving the emulated row timing signal and generating a column clock signal for activating the column decoders.

6. The interface circuit of claim 5, wherein the row timing circuit is substantially identical to the row timing emulator.

7. The interface circuit of claim 6, wherein the layout of the row timing emulator is substantially identical to the layout of the row timing circuit.

8. The interface circuit of claim 5, wherein the margin delay circuit includes programmable delay circuits for delaying generation of the column clock signal.

9. The interface circuit of claim 5, wherein the margin delay circuit receives a test signal for delaying generation of the column clock signal.

10. The interface circuit of claim 5, wherein the clock sequencer precharges the bitlines when an inactive clock cycle following an active system clock cycle is detected by a page mode control circuit.

11. A method for accessing a memory bank of an embedded DRAM within a single clock cycle of a system clock controlled by an interface circuit synchronized to the system clock comprising:

a) receiving address and commands on an edge of the system clock;

b) activating row decoders for driving a wordline of the memory bank corresponding to the address;

c) activating bitline sense amplifiers of the memory bank; and, d) activating column decoders of the memory bank at a predetermined delay time after the row decoders are activated.

12. The method of claim 11, wherein the delay time is longer for a read command than for a write command.

13. The method of claim 11, wherein the bitlines of the memory bank are precharged after the column decoders are activated.

14. The method of claim 11, wherein the interface is set for page mode operation.

15. The method of claim 14, wherein the bitlines of unselected memory banks are precharged after address and commands are received.

16. The method of claim 15, wherein the wordline is driven for the duration of the single clock cycle.

17. The method of claim 16, wherein all memory banks are precharged in an inactive system clock cycle following an active system clock cycle.

18. A clock sequencer of an interface circuit for controlling an embedded DRAM having column decoders, row decoders, bitline sense amplifiers and a row timing circuit for activating the row decoders and the bitline sense amplifiers comprising:
   a row timing emulator for receiving an activation clock signal synchronized to a system clock for generating an emulated row timing signal;
   a margin delay circuit for receiving the emulated row timing signal for generating a column clock signal for activating the column decoders, and a precharge clock signal;
   a page mode control circuit for receiving a page mode signal, the system clock and the activation clock signal for generating a page mode precharge clock signal; and,
   a clock combiner for receiving the page mode signal for activating the row timing circuit in response to one of a fast activation clock signal, the precharge clock signal, and the page mode precharge clock signal.

19. The clock sequencer of claim 18, wherein the row timing emulator is substantially identical to the row timing circuit.

20. The clock sequencer of claim 18, wherein the margin delay circuit includes programmable delay circuits for delaying generation of the column clock signal and the precharge clock signal.

21. The clock sequencer of claim 20, wherein the programmable delay circuits are configurable by registers.

22. The clock sequencer of claim 18, wherein the page mode control circuit includes programmable delay circuits for delaying generation of the page mode precharge clock signal.

23. The clock sequencer of claim 18, wherein the margin delay circuit generates the column clock signal in response to the emulated row timing signal after a first delay in a write operation.

24. The clock sequencer of claim 23, wherein the margin delay circuit generates the column clock signal in response to the emulated row timing signal after a second delay in a read operation.

25. The clock sequencer of claim 24, wherein the first delay is shorter than the second delay.

26. The clock sequencer of claim 18, wherein the page mode control circuit is disabled when the page mode control signal is inactive.

27. The clock sequencer of claim 18, wherein the page mode control circuit generates the page mode precharge clock signal when the page mode control signal is active and the memory access signal is inactive following an operation where the memory access signal is active.

28. The clock sequencer of claim 18, wherein the clock combiner generates the row clock signal in response to the precharge clock signal when the page mode control signal is inactive.

29. The clock sequencer of claim 18, wherein the clock combiner generates the row clock signal in response to the page mode precharge clock signal when the page mode control signal is active.

30. A method for customizing a row timing emulator and margin delay circuit of an interface circuit for controlling an embedded DRAM having a row timing circuit for activating row decoders and bitline sense amplifiers, and column decoders for accessing the bitlines comprising:
   a) determining an optimum bitline sense amplifier activation delay time for activating the bitline sense amplifiers after row addresses are latched;
   b) determining an optimum column decoder activation delay time for activating the column decoders after the bitline sense amplifiers are activated;
   c) programming delay elements of the row timing circuit for activating the bitline sense amplifiers at the optimum bitline sense amplifier activation delay time;
   d) programming delay elements of the row timing emulator for generating an emulated row timing signal at the optimum bitline sense amplifier activation time; and,
   e) programming delay elements of the margin delay circuit for activating the column decoders at the optimum column decoder activation delay time after receiving the emulated row timing signal.

31. The method of claim 30, wherein the step of determining an optimum column decoder activation delay time includes determining the optimum column decoder activation delay times for read operations and write operations.

32. The method of claim 31, wherein the margin delay circuit is programmed to activate the column decoders at the optimum column decoder activation delay times for read and write operations.

* * * * *